United States Patent [19] … [11] Patent Number: 5,457,003
Tanaka et al. … [45] Date of Patent: Oct. 10, 1995

[54] NEGATIVE WORKING RESIST MATERIAL, METHOD FOR THE PRODUCTION OF THE SAME AND PROCESS OF FORMING RESIST PATTERNS USING THE SAME

[75] Inventors: Akinobu Tanaka; Hiroshi Ban, both of Atsugi; Jiro Nakamura, Isehara; Takao Kimura, Mito; Yoshio Kawai, Isehara, all of Japan

[73] Assignee: Nippon Telegraph and Telephone Corporation, Tokyo, Japan

[21] Appl. No.: 99,398

[22] Filed: Jul. 30, 1993

Related U.S. Application Data

[63] Continuation-in-part of Ser. No. 724,115, Jul. 1, 1991, abandoned.

[30] Foreign Application Priority Data

Jul. 6, 1990 [JP] Japan .................................. 2-177257
Nov. 27, 1990 [JP] Japan .................................. 2-320781

[51] Int. Cl.$^6$ .................................................. G03F 7/075
[52] U.S. Cl. .................... 430/176; 430/175; 430/169; 430/280; 430/921; 430/922; 430/313; 430/330
[58] Field of Search .................... 430/175, 176, 430/169, 921, 922, 280, 313, 330

[56] References Cited

U.S. PATENT DOCUMENTS

| | | | |
|---|---|---|---|
| 4,665,006 | 5/1987 | Sachdev et al. | 430/176 |
| 4,985,342 | 1/1991 | Muramoto et al. | 430/280 |
| 5,079,129 | 1/1992 | Roth et al. | 430/176 |
| 5,098,816 | 3/1992 | Babich et al. | 430/280 |
| 5,110,711 | 5/1992 | Babich et al. | 430/280 |
| 5,141,840 | 8/1992 | Mizutani et al. | 430/921 |
| 5,158,854 | 10/1992 | Imamura et al. | 430/192 |

FOREIGN PATENT DOCUMENTS

| | | |
|---|---|---|
| 0315954 | 5/1989 | European Pat. Off. . |
| 0422570 | 4/1991 | European Pat. Off. . |

OTHER PUBLICATIONS

"A Photo–Patternable Stress Relief Material for Plastic Packaged Integrated Circuits", Cagan et al., IEEE Trans. on Components, Hybrids and Mannufacturing Technology, Dec. 1988, No. 4, New York, pp. 611–615.
"Multilayer Resist Systems and Processing", Lin, Solid State Technology, May 1983, pp. 105–112.
"A highly etch resistant, negative resist for deep–UV and electron beam lithography", McKean, et al., SPIE vol. 1262 Advances in Resist Technology and Processing VII (1990), pp. 110–118.
"Chemical Amplification Negative Resist Systems Composed of Novolak, Silanols, and Acid Generators", Ueno, et al., SPIE vol. 1262 Advances in Resist Technology and Processing VII (1990), pp. 26–31.
"28a–PC–8 Silicon–containing chemical amplification resist for electron beam lithography", 51st Scientific Election Meeting of Japanese Supply Physics Association, Preliminary Print. (1990).

Primary Examiner—Charles L. Bowers, Jr.
Assistant Examiner—Mark F. Huff
Attorney, Agent, or Firm—Spencer, Frank & Schneider

[57] ABSTRACT

A resist material comprises a polysiloxane obtained by hydrolysis and condensation with dehydration of one or more alkoxysilanes having an oxirane ring, or of a mixture of the alkoxysilane(s) having an oxirane ring and one or more alkoxysilanes having no oxirane ring, and an acid generator. The resist material may contain one or more of a spectral sensitizer, an organic polymer having a hydroxyl group or an epoxy compound. Resist patterns are formed by coating an organic polymer on a substrate and then the resist material on the film of the organic polymer to form a two layer resist having a bottom layer of the organic polymer and top layer of the resist material, prebaking, imagewise exposing high radiation, postbaking, and developing the resist with alkaline solutions to remove an unexposed portion of the top layer, and dry etching the bottom layer using the relic of the resist material as a mask. the temperature of the post baking is preferably lower than that of the prebaking.

31 Claims, 6 Drawing Sheets

EP: EPOXYCYCLOHEXYLETHYL

NEGATIVE WORKING RESIST MATERIAL, METHOD FOR THE PRODUCTION OF THE SAME AND PROCESS OF FORMING RESIST PATTERNS USING THE SAME

This application is a continuation-in-part of application Ser. No. 07/724,115, filed Jul. 1, 1991 now abandoned.

BACKGROUND OF THE INVENTION

1. Field of the Invention

The present invention relates to a resist material for use in lithography, for example, in the production of integrated circuits and more particularly to a resist material for two layer resists, which material reproduces negative patterns with high accuracy and has high resistance to oxygen plasma etching (high $O_2$RIE resistance). Also, the present invention relates to a method of producing such a negative working resist material, as well as to a process of forming resist patterns with such a negative working resist material.

2. DESCRIPTION OF THE PRIOR ART

Positive type photoresists composed of novolak resin and naphthoquinonediazide as a photosensitizer are featured by having high sensitivity, high resolution, and high solubility in alkaline solutions and have recently been used widely in the field of lithography. Resists are generally grouped into two types, one single layer resists and the other two layer resists (including silylated ones) having a top layer and a bottom layer. While the single layer resists are advantageous that they require simple processes more attention is paid to the two layer resists which can be formed into thin films in order to compensate for decrease in optical focal distance accompanying exposure with high resolution using a short wavelength radiation. In other words, the two layer resists can make the best of the performance of the exposure device used although the processes associated therewith are somewhat complicated.

In the conventional two layer resist system (B. J. Lin, *Solid State Technol.*, 26 (5), 105 (1983)), patterns with a high aspect ratio can be obtained by anisotropically etching the substrate by oxygen plasma etching ($O_2$RIE) using a thin film of the resist formed on the substrate as a mask. Hence, much importance is given to the resistance of the resist to $O_2$RIE. Generally, those materials which form oxides upon $O_2$RIE, typically those containing silicon (Si), are considered to have high resistance to $O_2$RIE. In this respect, photoresists currently put into practice are defective in that they have poor resistances to $O_2$RIE because they contain no silicon component. In order to avoid the defects, resist materials based on polysiloxane have heretofore been proposed. This type of resist materials generally have low glass transition temperatures. Because of this, there arise various severe problems in adaptability to the processes. More particularly, dusts tend to collect on the material during the processing, the thickness of the film prepared from the material is difficult to be controlled, and the developability of the material decreases due to the deformation of patterns upon development.

For example, conventional resist materials contain novolak resin, a silicon compound and an acid generator, and the silicon compound is rendered alkali-insoluble as a result of condensation with an acid generated by the acid generator upon exposure to high energy radiation (cf., D. R. McKean, et al., "A highly etch resistant, negative resist for Deep-UV and electron beam lithography", SPIE Vol. 1262 Advances in Resist Technology and Processing VII, pp. 110 (1990); and T. Ueno, et al., "Chemical Amplification Negative Resist Systems Composed of Novolac, Silanols, and Acid Generators", SPIE Vol. 1262, Advances in Resist Technology and Processing VII, pp.26 (1990)). The resist materials have low Si contents as low as 12% or less resulting in that they have low oxygen plasma resistance and pattern formation with high precision is difficult therewith.

Another conventional resist material composed of a polysiloxane and an acid generator (crosslinking agent) crosslinks with OH groups upon exposure, resulting in decreased solubility in aqueous alkali solutions (cf. The 51st Scientific Lecture Meeting of Japanese Applied Physics Association, Preliminary Print No. 28a-PC-8 (1990)). Thus, the utilization of crosslinking reaction fails to give acceptable resolution of patterns.

Few resist materials can be used for a wide variety of high energy radiations. Particularly, few are usable for both UV and deep UV which greatly differ in energy level one from another.

Therefore, there is a keen demand for alkali-developable type resist materials which have high glass transition temperatures and high resistance to $O_2$RIE and can be used for various high energy radiations.

SUMMARY OF THE INVENTION

An object of the present invention is to provide a negative working resist material which is alkali-developable, and has a high glass transition temperature, and high resistance to $O_2$-RIE.

Another object of the present invention is to provide a method of preparing a negative working resist material which is of an alkali-developable type, has a high glass transition temperature, and high resistance to $O_2$-RIE.

Still another object of the present invention is to provide a process of forming resist patterns using such a negative working resist material.

Under the circumstances, extensive investigations have been made to achieve the aforementioned objects, and as a result it has now been found that the use of a polymer having siloxane bonds as a skeletal structure increases resistance to $O_2$-RIE, that the introduction of a ladder-type chemical structure into the molecule of the polymer by using polyfunctional alkoxide as a raw material increases the glass transition temperature of the polymer, and that the introduction of silanol groups into the polymer makes it possible for the polymer to condense with dehydration in the presence of an acid upon exposure to high energy radiation to insolubilize the polymer, thus enabling the formation of negative patterns.

According to the first aspect of the present invention, a negative working resist material comprises:

(a) a polysiloxane obtained by hydrolysis and condensation with dehydration of an alkoxysilane including an oxirane ring therein, said polysiloxane having at least one silanol group and including therein partial structural units represented by formulae (1), (2) and (3), in combinations with respect to one another of (1), and (2) and/or (3) in which all bonds not shown are to oxygen

-continued

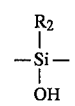

(2)

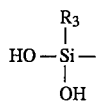

(3)

wherein $R_1$, $R_2$ and $R_3$ are organic groups which may be the same or different, wherein at least some of the organic groups represented by $R_1$, $R_2$ or $R_3$, respectively, include an oxirane ring or glycol residue thereof therein, and wherein at least some of the oxirane rings in said partial structural units have been hydrolyzed to form glycols, which glycols are present in said polysiloxane; and (b) an acid generator.

The phrase "in combinations with respect to one another of (1), and (2) and/or (3)" is intended to refer to combinations of partial structural units (1) and (2); (1) and (2) and (3); and (1) and (3) in which all bonds not shown in the formulae (1), (2), (3) are to oxygen, and are siloxane bonds, that is, Si—O—Si.

Here, $R_1$, $R_2$ and $R_3$, which are the same or different, each may be an alkyl group, an alkenyl group, a cycloalkyl group, a phenyl group, or a 4-tetrahydrophthalic anhydride group, preferably a 3-glycidoxypropyl group, a 2-(3,4-epoxycyclohexyl)ethyl group, an ethyl group, a methyl group, a phenyl group, or a 4-tetrahydro-phthalic anhydride group, and more preferably a 2-(3,4-epoxycyclohexyl)ethyl group or a phenyl group. The abundance of the groups represented by $R_1$, $R_2$ and $R_3$ and having an oxirane ring may be about 20 to 100% by mole based on total groups represented by $R_1$, $R_2$ and $R_3$. Preferably, the polysiloxane may be a weight average molecular weight of about 800 to about 10,000.

In the aforementioned resist material, the acid generator may be one selected from the class consisting of:

(i) an onium salt represented by formula (I), (II) or (III) below;

(I)

(II)

(III)

wherein R' is an unsubstituted or substituted aromatic group, and $MXn^-$ is a group selected from the group consisting of $BF_4^-$, $PF_6^-$, $AsF_6^-$, and $SbF_6^-$;

(ii) a halomethyltriazine;

(iii) tetrabromobispohenol A;

(iv) a nitrobenzyl ester compound; and (v) a trifluoromethanesulfonate compound.

The acid generator may preferably be diphenyl-4-thiophenoxyphenylsulfonium hexafluorophosphate. The acid generator may be contained in an amount of about 0.5 to about 20% by weight based on the weight of the resist material.

The aforementioned resist material may contain a spectral sensitizer, preferably phenathiazine. The resist material may also contain an organic polymer having a hydroxyl group. This organic polymer may be one selected from the group consisting of novolak resin, phenol resin, pyrogallol-acetone polymer and polyvinylphenol. The organic polymer may be contained in an amount of no more than about 10% by weight.

The aforementioned resist material may contain an epoxy compound. The epoxy compound may be one selected from the group consisting of ethylene glycol diglycidyl, epoxy resin, epoxystyrene, and epoxybutane. The amount of the epoxy compound may be no more than about 5% by weight based on the weight of the resist material.

According to the second aspect of the present invention, a negative working resist material comprises:

(a') a polysiloxane obtained by hydrolysis and condensation with dehydration of an alkoxysilane having an oxirane ring alone, or together with a alkoxysilane free of an oxirane ring, said polysiloxane having at least one silanol group, and having at least one glycol group formed by hydrolysis of at least some oxirane rings; and (b) an acid generator.

According to the third aspect of the present invention, a method of producing a negative working resist material, comprises the steps of:

hydrolyzing an alkoxysilane having an oxirane ring to form a hydrolyzate;

condensing with dehydration the hydrolyzate to form a polysiloxane having at least one silanol group and having at least one glycol group formed by hydrolysis of at least some oxirane rings; and mixing the polysiloxane with an acid generator.

According to the fourth aspect of the present invention, a method of producing a negative working resist material, comprises the steps of:

hydrolyzing an alkoxysilane having an oxirane ring and an alkoxysilane free of an oxirane ring to form a hydrolyzate;

condensing with dehydration the hydrolyzate to form a polysiloxane having at least one silanol group and having at least one glycol group formed by hydrolysis of at least some oxirane rings; and mixing the polysiloxane with an acid generator.

According to the fifth aspect of the present invention, a process of forming resist patterns comprises the steps of:

applying an organic polymer on a substrate to form a bottom layer on the substrate;

providing a negative working resist material as described in any of the embodiments in the foregoing;

coating the negative working resist material onto the bottom layer to form a top layer, thus forming a two layer resist on the substrate;

prebaking the two layer resist;

imagewise exposing the prebaked two layer resist with high energy radiation to obtain an exposed two layer resist having an exposed portion of the top layer and an unexposed portion of the top layer;

postbaking the exposed two layer resist to render the exposed portion of the top layer insoluble in an alkali developer;

developing the exposed two layer resist with an alkali developer to remove the unexposed portion of the top layer while retaining the insolubilized, exposed portion of the top layer on the first layer to form space corresponding to the unexposed portion of the top layer; and dry etching the bottom layer using the remaining exposed portion of the top layer as a mask to remove the bottom layer in a region beneath the space corresponding to the unexposed portion of the top layer.

Here, the postbaking may preferably be performed at a temperature lower than that at which the prebaking is carried out.

The resist material of the present invention is a mixture of the polysiloxane and the acid generator, and optionally the organic polymer having a hydroxyl group in the polymer, and the silanol groups contained therein can efficiently dehydrate and condensate upon exposure to high energy radiation with the acid generated by the acid generator serving as a catalyst so that it can give rise to highly sensitive, alkali-developable, nonswelling negative-type resists. Because it contains silicon, the resist material of the invention has high resistance to oxygen plasma etching or dry etching; it can be used as a top layer of two layer resists. Its feasibility in two layer resists enables the formation of fine patterns in a width of no larger than 0.5 μm, even as small as 0.25 μm, in a high aspect ratio, e.g., up to at least about 10.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
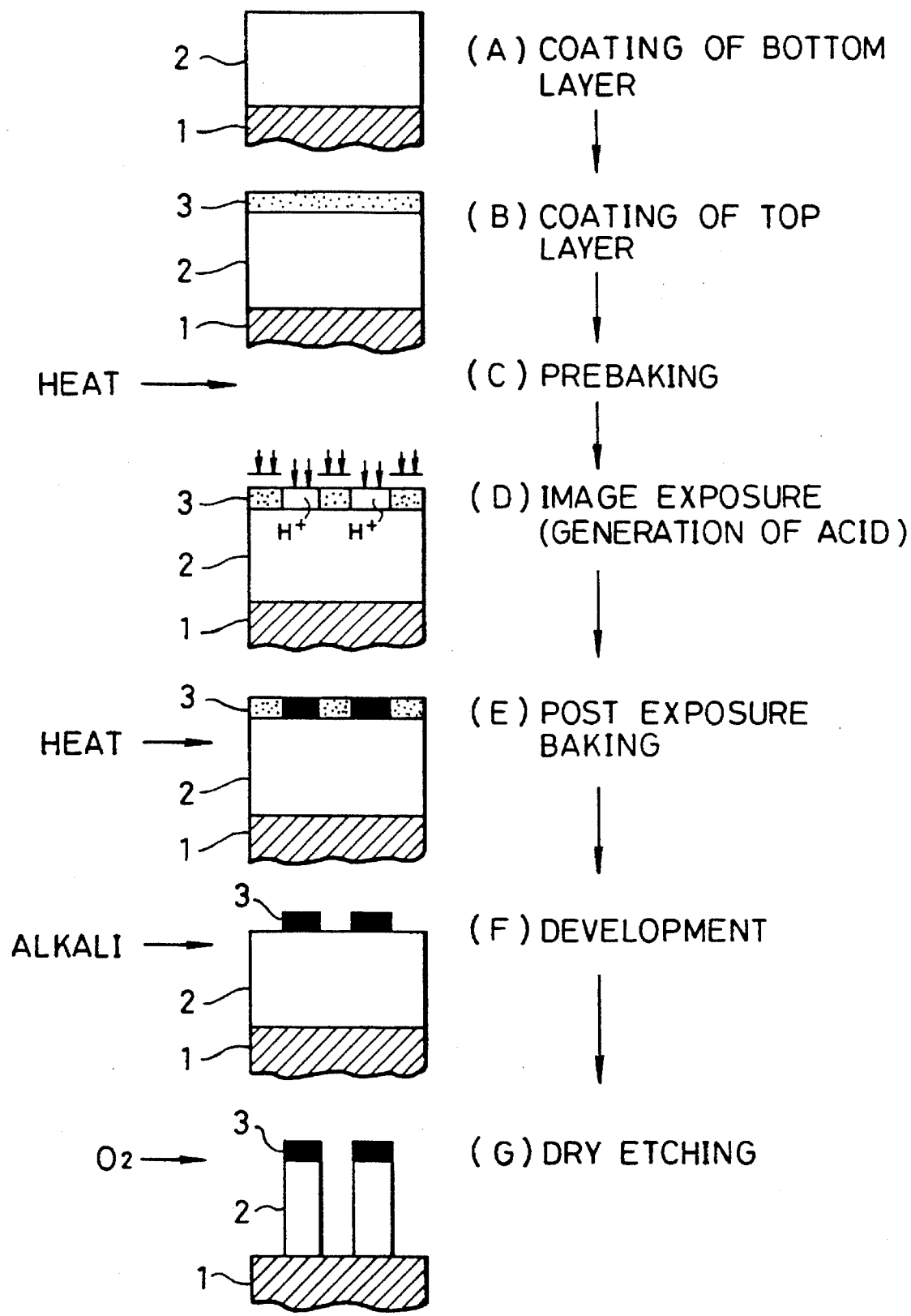
FIG. 1 is cross-sectional views illustrating a process of forming resist patterns according to the present invention.

The polysiloxane constituting the resist material of the present invention is a polysiloxane obtained by the hydrolysis and condensation with dehydration of either 1) one or more polyfunctional alkoxysilanes having an oxirane ring (hereafter, sometimes referred to also as oxirane-containing alkoxysilanes, or 2) one or more oxirane-containing alkoxysilanes and one or more aloxysilanes free of an oxirane ring (hereafter, sometimes referred to also as oxirane-free alkoxysilanes), and some or all of the pendant groups derived from the alkoxysilanes in the polysiloxane contain an oxirane ring. The term oxirane ring is also referred to as epoxy group.

More specifically, the polysiloxane used in the resist material of the invention has partial structural units represented by formulae (1) to (3), respectively, below, in combinations with respect to one another of (1), and (2) and/or (3) in which all bonds not shown are to oxygen:

In the above formulae, $R_1$, $R_2$ and $R_3$, which are the same of different, each represent an organic group such as an aliphatic hydrocarbon group, an alicyclic hydrocarbon group or an aromatic hydrocarbon group. The partial structural units represented by formulae (1), (2) and (3), respectively, are connected to each other so as to complete siloxane bonds. A part or all of a multiplicity of groups represented by $R_1$, $R_2$ and $R_3$, respectively, have an oxirane ring. In other words, some or each of the organic side chain groups or pendant groups of the polysiloxane, which are derived from the alkoxysilanes used as a starting material for the production thereof, contain an oxirane ring.

The polysiloxane contains typically the following ladder-type structure;

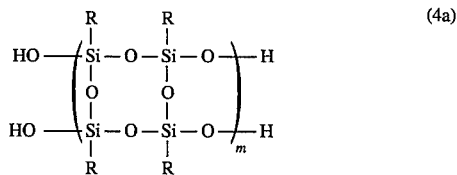

In formula (4a) above, m=1 to 10, and a multiplicity of R's, which are the same or different, each has the same meaning as $R_1$, $R_2$ or $R_3$.

In addition to the above, the polysiloxane may contain incomplete ladder-type structures represented by formulae (4b), (4c), (4d) and (4e), respectively, which correspond to those ladder-type structures in which some of the siloxane bonds;

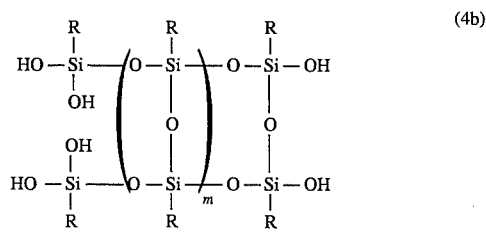

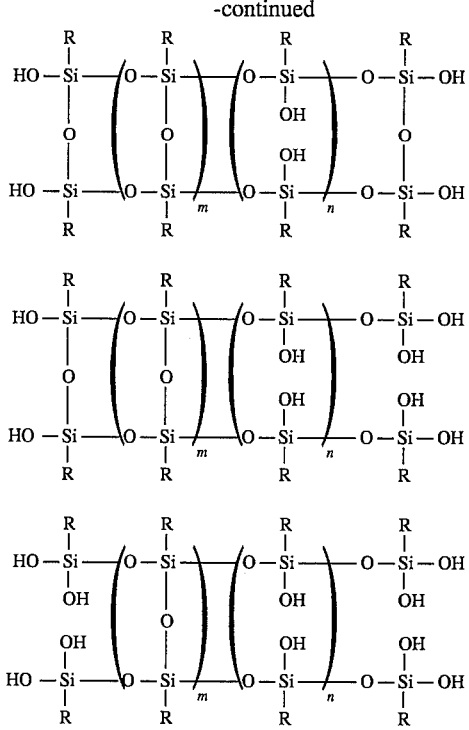

In formulae (4b) to (4e) above, m and n satisfy the following conditions:

m=1 to 10, n=0 to 10, and m+n≦10, and a multiplicity of R's, which are the same or different, each has the same meaning as $R_1$, $R_2$ or $R_3$.

When n=0, the ladder-type structure represented by formula (4e) consists of the partial structural units represented by formulae (1) and (3). This ladder-type structure is unstable and practically difficult to isolate since it has two OH groups attached to a single Si atom.

Examples of the aliphatic hydrocarbon group represented by $R_1$, $R_2$ or $R_3$ include an alkyl group preferably having 1 to 6 carbon atoms, such as a methyl group, an ethyl group, a propyl group, a hexyl group, etc.; an alkenyl group preferably having 2 to 4 carbon atoms such as a vinyl group, an allyl group, etc.; an acetoxy group, and the like.

Examples of the alicyclic hydrocarbon group represented by $R_1$, $R_2$ or $R_3$ include a cycloalkyl group preferably having 5 or 6 carbon atoms, such as a cyclohexyl group.

The aromatic hydrocarbon group represented by $R_1$, $R_2$ or $R_3$ is, for example, a phenyl group.

The aforementioned organic groups represented by $R_1$, $R_2$ or $R_3$ may have one or more substituents selected from, for example, fluorine; an amino group; a substituted amino group such as a 2-aminoethylamino group, an N-methylamino group, an N-allyl-N-(2-aminoethyl)amino group, an N-allyl-N-glycidylamino group, or an N,N-glycidylamino group; a mercapto group; a cyano group; a methacryloxy group, an acetoxy group, a 4-tetrahydrophtahlic anhydride group, and a 4-tetrahydrophthalic acid group.

Specific examples of the groups represented by $R_1$, $R_2$ or $R_3$ include a 3-glycidoxypropyl group, a 2-(3,4-epoxycyclohexyl)ethyl group, a 3-(N-allyl-N-glycidyl)aminopropyl group, a 3-(N,N-diglycidyl)aminopropyl group, a methyl group, an ethyl group, a propyl group, a hexyl group, a vinyl group, an allyl group, an amino group, a 3-(2-aminoethylamino)propyl group, an N-methylaminopropyl group, a 3-aminopropyl group, a 3-[N-allyl-N-(2-aminoethyl)]aminopropyl group, a 3-(N,N-diglycidyl)aminopropyl group, a 3-mercaptopropyl group, a 2-cyanoethyl group, a 3-methacryloxypropyl group, an acetoxy group, a 4-tetrahydrophthalic anhydride group, a 4-tetrahydrophthalic acid group, etc.

In the case where the polysiloxane is prepared by hydrolysis and condensation with dehydration of one or more of the oxirane-containing alkoxysilanes, it can be prepared generally by the following method. First, a specified alkoxysilane or alkoxysilanes is or are dissolved in an alcohol such as ethanol, and water and a catalyst such as hydrochloric acid are added to the resulting solution. The catalyst may be omitted, if desired. While this reaction proceeds usually at room temperature, the reaction may be carried out with heating at about 100° C., for example. After a predetermined time (e.g, for 2 to 10 hours), the reaction mixture is introduced in water to form precipitates. After being filtered, the product is dried usually at 50° C. The product in this stage may be put into practical use, or it may be introduced in a suitable solvent (e.g., dimethylacetamide (DMAc) containing an alkali catalyst or the like and allowed to react further when a polymer with a higher molecular weight is desired. It is also effective to heat the product in a bulk at about 120° to 140° C., for example, so that the condensation reaction can proceed further. Because the alkoxysilanes produce silanols during this reaction and the silanol groups are introduced in the polymer, the resulting polysiloxane dissolve in aqueous alkali solutions.

The catalyst which can be used for the production of the polysiloxane is not limited particularly and includes, for example, acid catalysts such as hydrochloric acid, hydrofluoric acid, nitric acid, sulfuric acid, acetic acid, and formic acid, and alkali catalysts such as ammonia, sodium hydroxide, potassium hydroxide, and calcium hydroxide.

The polysiloxane obtained by hydrolysis and condensation with dehydration of the alkoxysilanes generally has silanol groups at terminals thereof, and there is a possibility that the silanol groups condensate with each other to change the characteristics of the polysiloxane with time. This disadvantage can be avoided by adding a silylating agent to the reaction system to substitute the silanol groups by nonreactive substituents. However, the silylation must be controlled carefully in view of the solubility of the polysiloxane in alkalis. Suitable examples of the silylating agent include trimethylsilyl chloride, hexamethyldisilazane, etc.

Specific examples of the oxirane-containing alkoxysilane include 3-glycidoxypropyltrimethoxysilane, 3-glycidoxypropylmethyldimethoxysilane, 2-(3,4-epoxycyclohexyl)ethyltrimethoxysilane, 3-(N-allyl-N-glycidyl)aminopropyltrimethoxysilane, 3-(N,N-diglycidyl)aminopropyltrimethoxysilane, 3-glycidoxypropyltriethoxysilane, 3-glycidoxypropylmethyldiethoxysilane, 2-(3,4-epoxycyclohexyl)ethyltriethoxysilane, 3-(N-allyl-N-glycidyl)aminopropyltriethoxysilane, 3-(N,N-diglycidyl)aminopropyltriethoxysilane, etc.

Polysiloxanes obtained by copolymerization of one or more of the oxirane-containing alkoxysilanes with one or more of the oxirane-free alkoxysilanes may also be used in the present invention. The copolymerization may be carried out under substantially the same hydrolysis and dehydration conditions as the aforementioned polymerization (hydrolysis and condensation with dehydration) of the oxirane-containing alkoxysilane(s).

The oxirane-free alkoxysilanes are not limited particularly and any conventional alkoxysilanes which have no oxirane ring may be used. Specific examples thereof include dimethoxydimethylsilane, diethoxydimethylsilane, dimethoxymethyl-3,3,3-trifluoropropylsilane, diethoxydivinylsilane, diethoxydiethylsilane, 3-aminopropyldiethoxymethylsilane, 3-(2-aminoethylaminopropyl)dimethoxymethylsilane, dimethoxymethylphenylsilane, diethoxymethylphenylsilane, dimethoxydiphenylsilane, diethoxydiphenylsilane, tris(2-methoxyethoxy)vinylsilane, methyltrimethoxysilane, ethyltrimethoxysilane, 3,3,3-tripropyltrimethoxysilane, methyltriethoxysilane, 3-(N-methylaminopropyl)trimethoxysilane, methyltris(2-aminoethoxy)silane, triacetoxyvinylsilane, triethoxyvinylsilane, ethyltriethoxysilane, 2-mercaptoethoxysilane, 3-(2-aminoethylaminopropyl)trimethoxysilane, phenyltrimethoxysilane, 2-cyanoethyltriethoxysilane, allyltriethoxysilane, 3-glycidoxypropyltrimethoxysilane, propyltriethoxysilane, hexyltrimethoxysilane, 3-aminopropyltriethoxysilane, 3-methacryloxypropyltrimethoxysilane, methyltripropoxysilane, phenyltriethoxysilane, 3-(N-allyl-N-(2-aminoethyl))aminopropyltrimethoxysilane, 3-(N-allyl-N-glycidyl)aminopropyltrimethoxysilane, 3-(N,N-diglycidyl)aminopropyltrimethoxysilane, 4-trimethoxysilyltetrahydrophthalic anhydride, 4-triethoxysilyltetrahydrophthalic anhydride, 4-triisopropoxysilyltetrahydrophthalic anhydride, 4-trimethoxysilyltetrahydrophthalic acid, 4-triethoxysilyltetrahydrophthalic acid, 4-triisopropoxysilyltetrahydrophthalic acid, tetramethoxysilane, tetraethoxysilane, tetrabutoxysilane, n-butyltrichlorosilane, dimethyldichlorosilane, ethyltrichlorosilane, methyltrichlorosilane, phenyltrichlorosilane, trichlorovinylsilane, diphenyldichlorosilane, etc. Among these compounds, particularly preferred are phenyltriethoxysilane, phenyltrimethoxysilane, methyltriethoxysilane and tetraethoxysilane in view of ease of getting starting materials thereof, high reactivity, and desirable characteristics of products thereof.

Particularly preferred oxirane-containing alkoxysilane is 2-(3,4-epoxycyclohexyl)ethyltriethoxysilane, and phenyltriethoxysilane is particularly preferred as the oxirane-free alkoxysilane. It is preferred to use these in combination.

The polysiloxane used in the resist material of the present invention usually has a weight average molecular weight of about 800 to about 10,000. If the molecular weight is lower than about 800, the sensitivity is insufficient while the molecular weight exceeding about 10,000 results in poor stability with time. The abundance of oxirane ring in the polysiloxane is about 20 to about 70% by mole based on total pendants. If it is lower than about 20% by mole, the polysiloxane has too low a solubility in alkali developers. If the abundance of oxirane ring exceeds about 70% by mole, the polymer has a glass transition temperature below 50° C. Generally, higher silicon (Si) content is more advantageous in order to obtain higher resolution, and usually it is preferred to use no less than about 15% by weight of S: based on the weight of the polysiloxane.

While the higher the glass transition temperature of resist materials is, the higher resolution they have and they usually must have a glass transition temperature of at least 50° C., preferably 100° C., it is generally difficult to obtain polysiloxanes having a glass transition temperature higher than about 150° C. Hence, it is preferred that the polysiloxane used in the invention has a glass transition temperature within the range of about 100° to 150° C.

The polysiloxane used in the present invention has an optical transmission of no lower than 90% at 248 nm in a thickness of 1 µm. When phenyltriethoxysilane is used in an amount of 50 mole % in the production of the polysiloxane, the polysiloxane has an optical transmission of no lower than 70%, and therefore it is hopeful for a resist material for excimer lasers. It is important to copolymerize phenyltriethoxysilane in order to increase the glass transition temperature, Tg, and its composition is determined depending on optical transmission and solubility in alkali of the resulting polymer. If the amount of phenyltriethoxy-silane added is above 80% by mole, or the abundance of phenyl group as pendant in the polysiloxane is above 80% by mole, the solubility of the polysiloxane in an aqueous alkali solution decreases greatly so that alkali development is difficult to be performed. This is presumed due to the fact that epoxy groups have higher affinities for water than phenyl groups do. Preferably, the abundance of phenyl group, or the amount of phenylalkoxysilane to be added, is 30 to 80% by mole.

For example, when a mixture of 2-(3,4-epoxycyclohexyl)ethyltrimethoxysilane as the oxirane-containing alkoxysilane and phenyltriethoxysilane as the oxirane-free alkoxysilane are reacted, a polysiloxane having the following ladder-type structure is obtained.

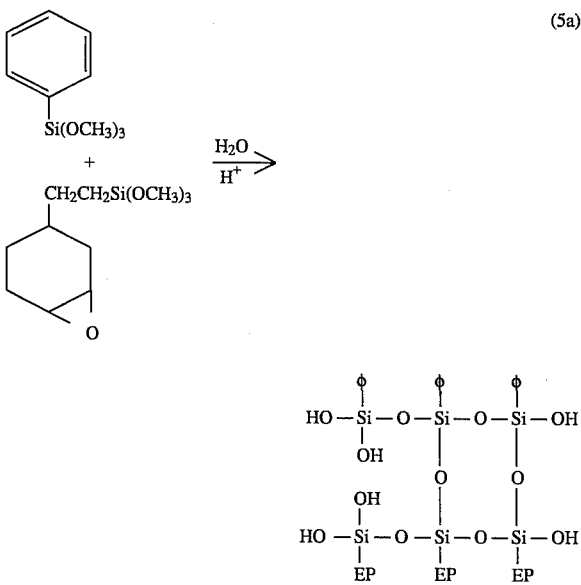

(5a)

In formula (5a) above, EP represents a 2-(3,4-epoxycyclohexyl)ethyl group, and φ represents a phenyl group. Any φ may be interexchanged for any EP and vice versa.

Also, the resulting polysiloxane may contain any of the following incomplete ladder-type structures represented by formulae (5b), (5c), (5d) and (5e), respectively,

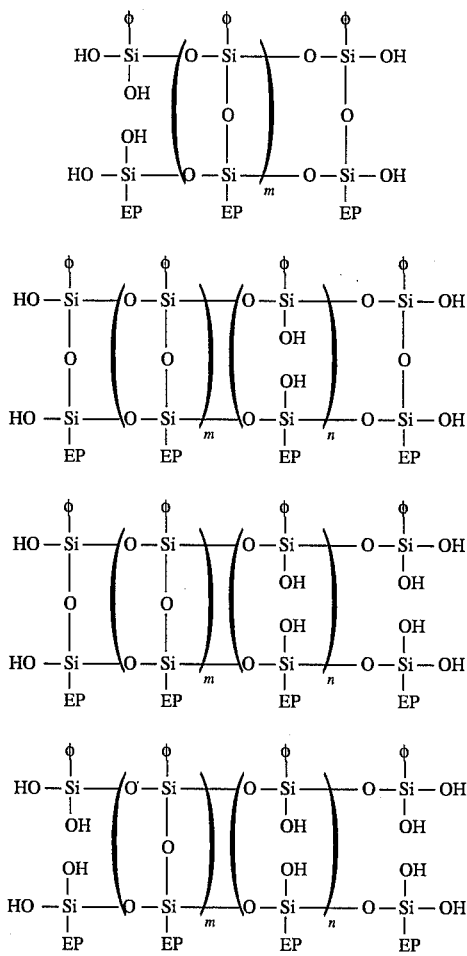

In formulae (5b) to (5e) above, EP represents a 2-(3,4-epoxycyclohexyl)ethyl group, φ represents a phenyl group. Any φ may be interexchanged for any EP and vice versa, and m and n satisfy the following conditions m=1 to 10, n=1 to 10, and m+n≦10.

Resist materials composed mainly of polysiloxane may be combined with a suitable sensitizer and put to various applications. However, orthonaphthoquinone type sensitizers have increased absorption at wavelengths no longer than 300 nm and in addition do not fade with irradiation of light; they are unsuitable for resist materials for use in lithography using, as a light source, radiation with wavelengths in the region of deep ultraviolet rays such as excimer lasers (e.g., KrF excimer laser). Accordingly, in the present invention, acid generators are used as a sensitizer. Since silanol groups remaining in the polysiloxane dehydrate and condensate efficiently in the presence of the acid generated from the acid generator as a catalyst, the amount of the acid generator to be added may be small, resulting in reduced optical absorption in the deep ultraviolet region.

The acid generator used in the present invention is not limited particularly and may include onium salts represented by the following general formulae (I), (II) and (III), respectively, below;

  (I)

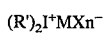  (II)

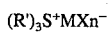  (III)

wherein Ar or a multiplicity of (R')'s, which are the same or different, each represent an aromatic group or a substituted aromatic group, for example, a phenyl group, a naphthyl group, etc. which may be substituted with a t-butyl group, a methoxy group, a phenoxy group, a thiophenoxy group or the like; and $MXn^-$ represents a member selected from the group consisting of $BF_4^-$, $PF_6^-$, $AsF_6^-$, and $SbF_6^-$ (e.g., diphenyl-4-thiophenoxyphenylsulfonium hexafluorophosphate), triflate compounds (e.g., bis(t-butylphenyl)iodonium triflate, triphenylsulfonium triflate, etc.), halomethyltriazines (e.g., dibromomethyltriazine, 2,4-bis(trichloromethyl)-6-phenyl-1,3,5-triazine, 2,4,6-tris(trichloromethyl)-1,3,5-triazine, etc.), tetrabromobisphenol A, nitrobenzyl ester compounds (e.g., 2,6-dinitrobenzyl tosylate). While the acid generators include those having low sensitivities to ultraviolet rays with wavelengths no shorter than 300 nm, such low-sensitive acid generators can also be used with simultaneous addition of a spectral sensitizer such as phenathiazine.

Among the aforementioned acid generators, one which gives the highest resolution and excellent storage stability of resist material is diphenyl-4-thiophenoxyphenylsulfonium hexafluorophosphate.

In the resist composition of the present invention, the acid generator also serves as a dissolution inhibitor for siloxane polymer in alkali solutions. The acid generator may be added usually in an amount of 0.5 to 20% by weight. If this amount is below 0.5% by weight, the amount of the acid generated is too small to make it possible to increase the sensitivity. On the other hand, if the amount exceeds 20% by weight, the silicone content required for resist materials decreases to thereby deteriorate oxygen plasma etching resistance ($O_2$RIE resistance) and increase the absorption at 248 nm. Generally, preferred amount of the acid generator is about 5% by weight.

The organic polymer having a hydroxyl group used in the present invention is not limited particularly, and various polymers such as novolak resins, phenol resins, pyrogallolacetone polymers, polyvinylphenols may be used so far as they contain one or more hydroxyl groups in the molecule. These polymers are effective not only in improving the adhesion between the resist and the substrate but also in improving the storage stability of the resist. It is sufficient to add the organic polymer in an amount of 10% by weight based on the polysiloxane.

The epoxy compound may be either aliphatic or aromatic. For example, ethylene glycol diglycidyl, Epikote 815 (epoxy resin, trade name for the product by Shell Co.), Epikote 1001 (trade name for epoxy resin produced by Shell Co.), epoxystyrene, epoxy-butane, etc. can be used. Smaller epoxy equivalent of the epoxy compound is more advantageous because on that occasion the amount of the epoxy compound to be used can be reduced. When the amount of the epoxy compound is no larger than 5% by weight based on the polymer (polysiloxane), it gives a great effect on the storage stability of the resist.

As the solvent, those resist solvents used commonly such as 2-ethoxyethyl acetate, ethyl lactate, and methoxy-2-propanol may be used.

Next, the process of forming patterns using the resist material of the present invention will be described below.

Figure 2:
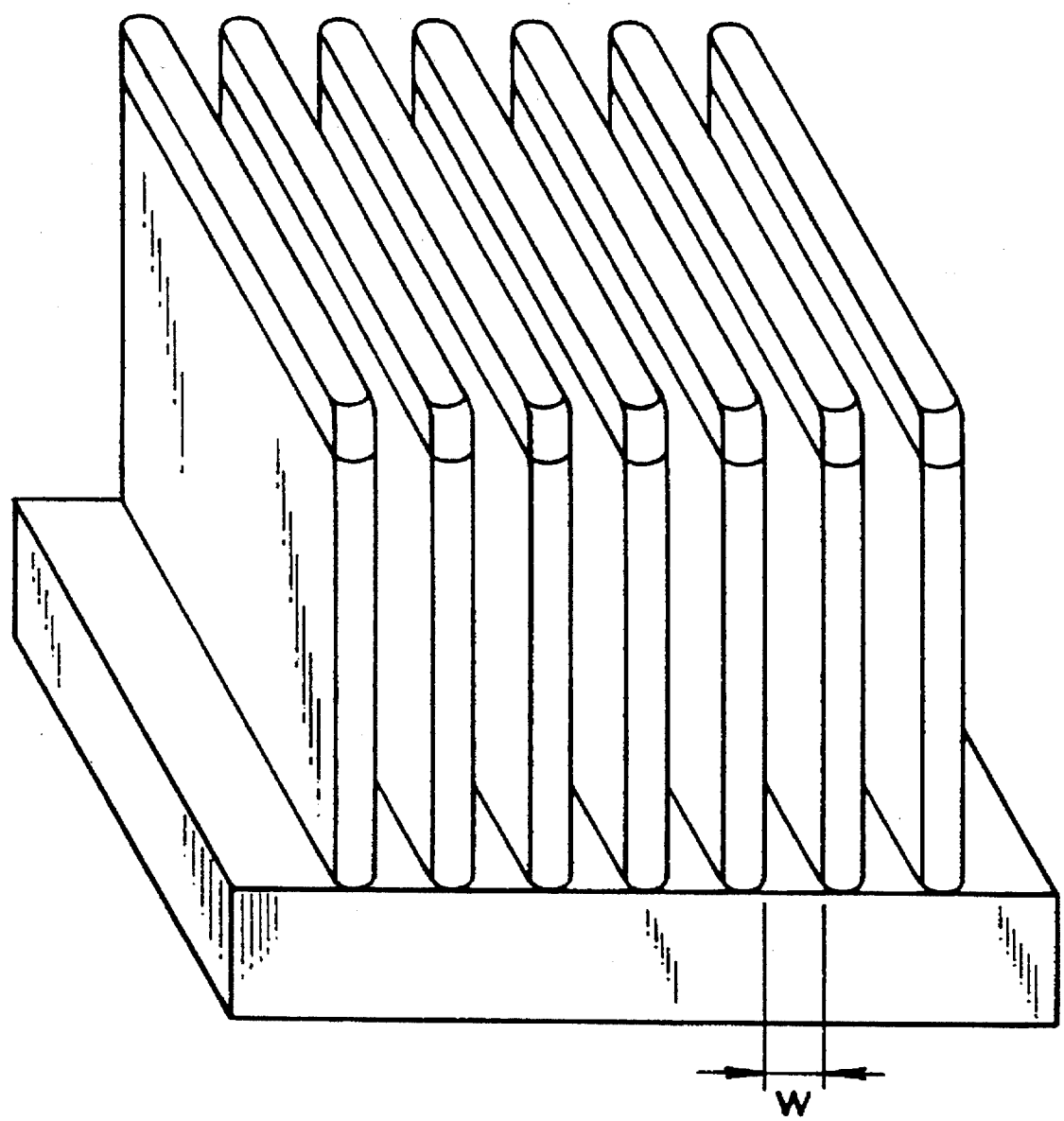
FIG. 2 is a schematic perspective view showing a resist pattern formed according to the process of the present invention.

FIG. 1 is cross-sectional views illustrating the process of forming resist patterns according to the present invention, and FIG. 2 is a schematic perspective view showing the resist pattern formed according to Example 9 hereinbelow depicted based on scanning electron micrograph. Firstly, on a substrate 1 such as silicon wafer is formed a thin film 2 of the organic polymer (step A: coating of a bottom layer), and a thin film 3 of the resist composition of the invention is formed by coating on the organic polymer film 2 to complete a two layer structure on the substrate, of which structure the organic polymer film is a bottom layer 2, and the film of the resist composition of the invention is a top layer 3 (step B: coating of a top layer). Then, after prebaking (step C: prebaking), high energy radiation is irradiated onto the two layer structure to release acid from the acid generator contained in the resist composition (step D: imagewise exposure). The exposed resist is heated so that hydroxyl groups in the silanols in the top layer can condense with dehydration with the acid formed in the step C serving as a catalyst for the condensation reaction (step E: post exposure baking (hereafter, sometimes referred to as PEB)). As a result, the irradiated portion is rendered insoluble in an aqueous alkali solution. Thereafter, the resist material in the region other than the irradiated portion (i.e., unexposed region) is removed with an alkali developer (step F: development). Then, the lower layer is dry-etched using oxygen and using the resist material in the irradiated portion which has remained after the alkali development as a mask so that the organic polymer film beneath the resist material can be etched off (step G: dry etching), thus forming a resist pattern. As the organic polymer material, any type of organic polymer may be used so far as it can be etched with oxygen plasma. However, aromatic group-containing polymers are preferred because some resistance is required for the organic polymer when the substrate is dry-etched after the pattern formation using the etched (patterned) organic polymer as a mask.

In the process of forming patterns according to the present invention, diffusion of the acid generated by the acid generator can be prevented by performing PEB at a temperature lower than that at which the prebaking is carried out, thus making it possible to form patterns with high resolution.

The top and bottom layers of the two layer resist of the invention, respectively, can be coated by a conventional coating method, for example, spin coating. The prebaking is performed usually at 100° to 120° C., preferably 105° to 110° C. The high energy radiation which can be used in the present invention include electron beams, X rays, deep UV rays, and UV rays. PEB can be carried out at 55° to 90° C., preferably 65° to 75° C. The dry etching can be performed using oxygen gas as an etching gas, for example, in a parallel flat plate type sputter-etching apparatus usually under the conditions of RF power being 0.1 to 0.2 W/cm$^2$, and O$_2$ gas partial pressure of 5 to 15 mTorr for 10 to 30 minutes.

In the aforementioned process of forming patterns, the use of PEB temperature lower than the prebaking temperature prevents the diffusion of acid generated by the acid generator, resulting in high resolution pattern formation.

Generally, resolution limits thus far reached using g line (436 nm) and i line (365 nm) from a high pressure Hg lamp are 0.5 μm and 0.4 μm, respectively. On the other hand, resolution limit is 0.3 μm when a KrF excimer laser (248 nm) is used. While it will be possible to fabricate generally 64 Mbit LSI and the like using a resist material having resolution limit of 0.3 μm the width of patterns actually obtained will be 0.35 μm when a resist material having resolution limit of 0.3 μm is used. There is a general impression that further increase in contrast would seem difficult to be obtained by approaches attempting to improve radiation source. The present invention is directed to improvement of resolution limit by improving resist materials. If resolution limit of 0.25 μm is reached it is beyond expectation to fabricate 256 Mbit practical devices. Thus, it is advantageous to realize fine patterns with features of 0.25 μm or less.

In fact, the resist material of the present invention has high optical transmittance (no lower than 70%), high resolution, and high sensitivity (20 mJ/cm$^2$). It also has high Si content (not lower than 17% by weight) and high oxygen plasma resistance. As a result, it can be used as a material for forming the upper layer of a two layer resist. In KrF lithography, the resist material of the present invention gives rise to fine patterns with features of W=0.25 μm or less at a high aspect ratio (about 3/0.25=12) as schematically illustrated in FIG. 2. With the resist material of the present invention, the fabrication of quarter micron or submicron super LSI is made possible. It is also possible to use the resist material of the invention in electron beam lithography and X ray lithography. In these cases, pattern formation with features of 0.2 μm or less is possible.

The process of forming patterns according to the present invention cause less undercut and thus enables subsequent formation of dry-etched patterns of the substrate with the feature of the substrate pattern being substantially the same as that of the resist because the resin material used has high O$_2$RIE resistance and narrow line-space width.

EXAMPLES

The present invention will be explained in more detail by way of examples. However, it should not be understood that the present invention is limited thereto.

Preparation Example 1

3-Glycidoxypropyltrimethoxysilane (23.6 g; 0.1 mol) was dissolved in ethanol, and an aqueous hydrochloric acid was added to the resulting solution while stirring it. After reacting the mixture at room temperature for 24 hours, the reaction was continued at 60° C. for another 144 hours. After cooling it down to room temperature, ammonia was added to the reaction mixture and the reaction was continued further for 24 hours. After completion of the reaction, the reaction mixture was introduced into distilled water, and the resulting precipitates were filtered to obtain a white polymer. The product was soluble in various organic solvents such as tetrahydrofuran (THF), ethanol, ethylene glycol monoethyl ether (ethylcellosolve), methyl isobutyl ketone (MIBK), and acetone. From solutions of these solvents were obtained transparent uniform films.

Preparation Example 2

3-Glycidoxypropyltrimethoxysilane (11.8 g; 0.05 mol) and phenyltriethoxysilane (12.0 g; 0.05 mol) were dissolved in ethanol, and an aqueous hydrochloric acid was added to the resulting solution while stirring it. After reacting the mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcello-solve, MIBK, acetone, and ethyl acetate. From solutions of these solvents were obtained transparent uniform films.

Preparation Example 3

3-Glycidoxypropyltrimethoxysilane (11.8 g; 0.05 mol) and methyltriethoxysilane (8.9 g; 0.05 mol) were dissolved in ethanol, and an aqueous hydrochloric acid was added to the resulting solution while stirring it. After reacting the mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcello-solve, MIBK, acetone, and ethyl acetate. From solutions of these solvents were obtained transparent uniform films.

Preparation Example 4

3-Glycidoxypropyltrimethoxysilane (4.72 g; 0.02 mol), methyltriethoxysilane (8.9 g; 0.05 mol), and tetraethoxysilane (6.24 g; 0.03 mol) were dissolved in ethanol, and an aqueous hydrochloric acid was added to the resulting solution while stirring it. After reacting the mixture at room temperature for 6 hours, ammonia was added to the reaction mixture and the reaction was continued at 60° C. for further 24 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, acetone, and ethyl acetate. From solutions of these solvents were obtained transparent uniform films.

Preparation Example 5

2-(3,4-Epoxycyclohexyl)ethyltrimethoxysilane (24.6 g; 0.1 mol) was dissolved in ethanol, and an aqueous hydrochloric acid was added to the resulting solution while stirring it. After reacting the mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, and acetone. From solutions of these solvents were obtained transparent uniform films.

Preparation Example 6

Figure 3:
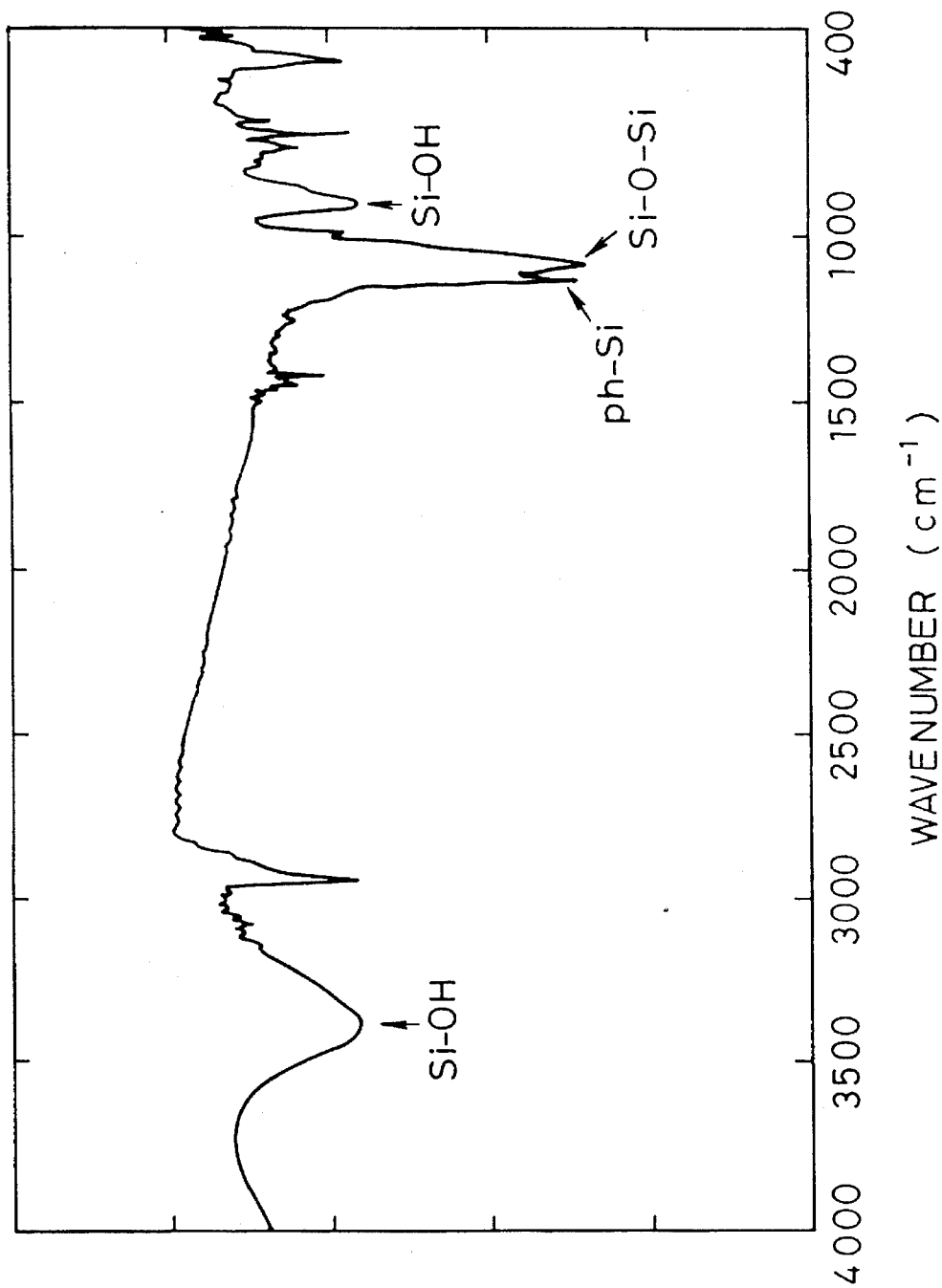
FIG. 3 is a chart illustrating an infrared absorption spectrum of the alkali-soluble polysiloxane prepared according to Preparation Example 6 of the present invention.
Figure 4:
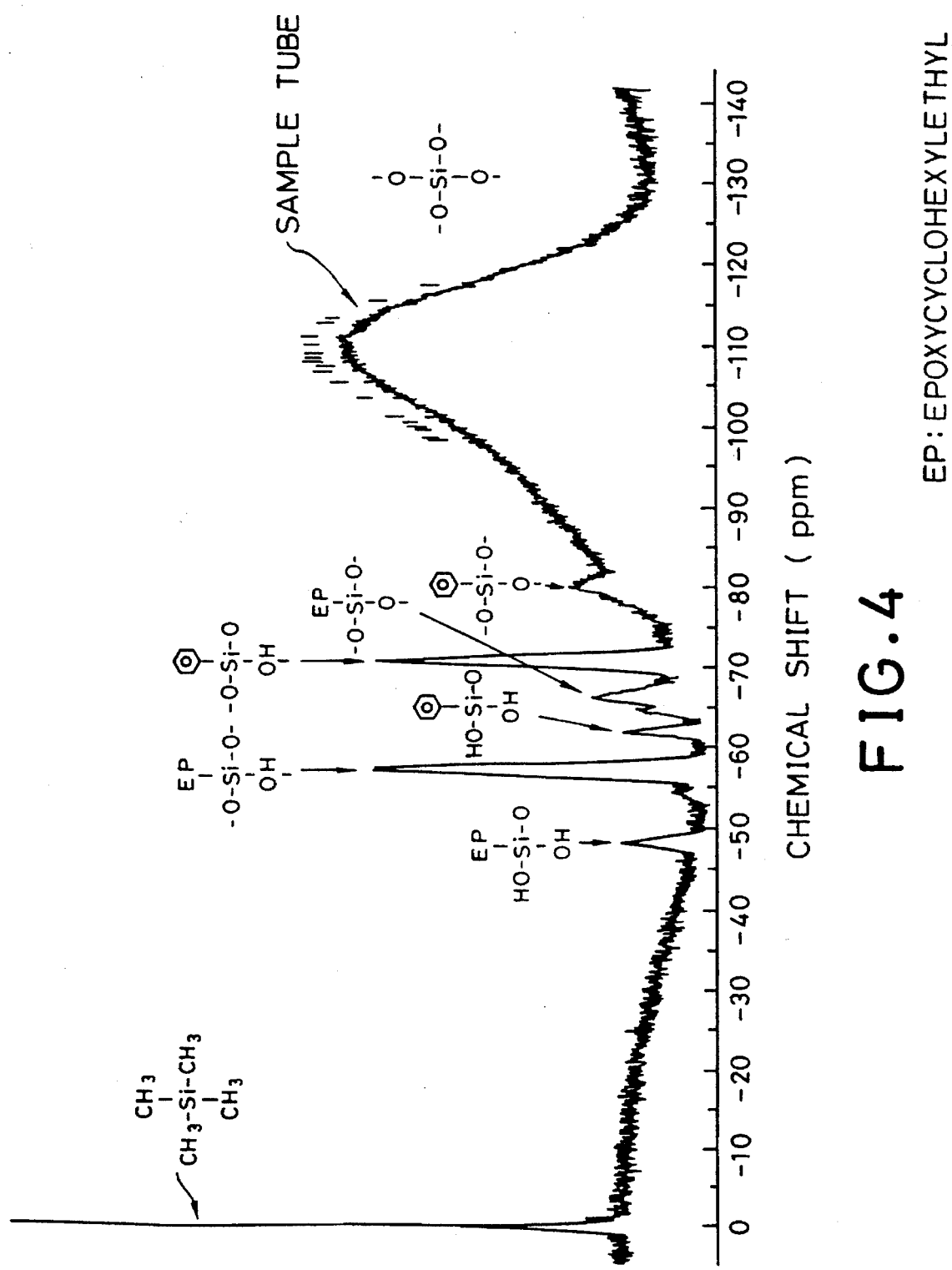
FIG. 4 is a chart illustrating a $^{29}$Si-NMR spectrum of the alkali-soluble polysiloxane prepared according to Preparation Example 6 of the present invention.

2-(3,4-Epoxycyclohexyl)ethyltrimethoxysilane (12.3 g; 0.05 mol) and phenyltriethoxysilane (13.6 g; 0.05 mol) were dissolved in ethanol, and an aqueous hydrochloric acid was added to the resulting solution while stirring it. After reacting the mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, and acetone. From solutions of these solvents were obtained transparent uniform films. The polymer was subjected to infrared absorption analysis, and nuclear magnetic resonance analysis using $^{29}$Si. FIG. 3 is a chart illustrating an infrared absorption spectrum of the polymer. In FIG. 3, absorptions by OH groups in silanol were observed at 3,400 cm$^{-1}$ and 905 cm$^{-1}$. FIG. 4 is a $^{29}$Si-NMR chart illustrating peaks of Si assigned to the following partial structural units represented by formulae (1A) to (6A), respectively, below;

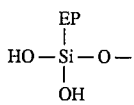
(1A)

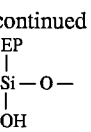
(2A)

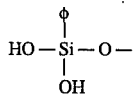
(3A)

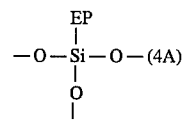
(4A)

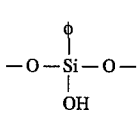
(5A)

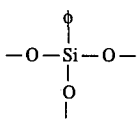
(6A)

where EP represents an organic radical containing an epoxy group, and φ represents a phenyl group, at −48 ppm, −57 ppm, −62 ppm, −67 ppm, −71 ppm, and −81 ppm, respectively. The polymer had a molecular weight of about 1,500.

Preparation Example 7

2-(3,4-Epoxycyclohexyl)ethyltrimethoxysilane (12.3 g; 0.05 mol) and methyltriethoxysilane (8.9 g; 0.05 mol) were dissolved in ethanol, and an aqueous hydrochloric acid was added to the resulting solution while stirring it. After reacting the mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, acetone, and ethyl acetate. From solutions of these solvents were obtained transparent uniform films.

Preparation Example 8

2-(3,4-Epoxycyclohexyl)ethyltrimethoxysilane (4.92 g; 0.02 mol), methyltriethoxysilane (8.9 g; 0.05 mol), and tetraethoxysilane (6.24 g; 0.03 mol) were dissolved in ethanol, and an aqueous hydrochloric acid was added to the resulting solution while stirring it. After reacting the mixture at room temperature for 6 hours, ammonia water was added to the reaction mixture, and the reaction was continued at 60° C. for further 24 hours. After cooling it to room temperature, ammonia water was added to the reaction mixture, and the reaction was continued for additional 12 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, acetone, and ethyl acetate. From solutions of these solvents were obtained transparent uniform films.

Preparation Example 9

2-(3,4-Epoxycyclohexyl)ethyltrimethoxysilane (4.92 g; 0.02 mol) and phenyltriethoxysilane (19.2 g; 0.08 mol) were dissolved in ethanol, and an aqueous hydrochloric acid solution was added to the resulting solution while stirring it. After reacting the resulting mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, acetone, and ethyl acetate. From solutions of these solvents were obtained transparent uniform films.

Preparation Example 10

2-(3,4-Epoxycyclohexyl)ethyltrimethoxysilane (2.46 g; 0.01 mol), 4-trimethoxysilyltetrahydrophthalic acid anhydride (2.72 g; 0.01 mol), and phenyltriethoxysilane (19.2 g; 0.08 mol) were dissolved in ethanol, and an aqueous hydrochloric acid solution was added to the resulting solution while stirring it. After reacting the resulting mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, acetone, and ethyl acetate. From solutions of these solvents were obtained transparent uniform films.

Example 1

The polysiloxanes obtained in Preparation Examples 1 to 11 were each mixed with 10% by weight of 2,6-dinitrobenzyl tosylate to prepare resist compositions. The respective resist compositions were coated on a silicon wafer in a thickness of about 0.3 µm by a conventional spin coating method, and prebaked at 100° C. for 20 minutes. After the prebaking, each coated substrate was imagewise irradiated with a high energy radiation (electron beams, X rays, deep ultraviolet rays). On this occasion, in the case of deep UV rays, peak wavelength was set up to 257 nm (cold mirror CM-250). After the imagewise irradiation, the coated substrates were each heated on a hot plate at 80° C. for 5 minutes to effect postbaking (PEB), followed by development with a developer composed of HPRD 402 (trade name for an aqueous alkali solution containing about 3% by weight of tetramethylammonium hydroxide (TMAH), manufactured by Fuji Hunt Co., hereafter the same) and water in a blend ratio of 1:1. $D_{50}$, the amount of radiation irradiated with the thickness of the film remaining after the irradiation was 50% of the initial thickness of the film prior to the irradiation, was defined as sensitivity of the resist.

Table 1 shows the sensitivity and resolution of each resist composition. Resolution was evaluated by forming line & space patterns. Each of the resist materials enabled the formation of patterns at a width of no larger than 0.3 µm.

TABLE 1

| Preparation | Example | 1 | 2 | 3 | 4 | 5 | 6 | 7 | 8 | 9 | 10 | 11 |
|---|---|---|---|---|---|---|---|---|---|---|---|---|
| Electron Beam | Sensitivity ($\mu C/cm^2$) | 10 | 8 | 5 | 5 | 5 | 5 | 10 | 5 | 5 | 5 | 5 |
| (Acceleration voltage 20KV) | Resolution (µm) | 0.2 | 0.2 | 0.2 | 0.3 | 0.2 | 0.3 | 0.3 | 0.3 | 0.3 | 0.2 | 0.2 |
| X Ray | Sensitivity ($mJ/cm^2$) | 80 | 70 | 65 | 60 | 65 | 65 | 80 | 64 | 65 | 65 | 65 |
| (Cul line 13.3) | Resolution (µm) | 0.3 | 0.3 | 0.3 | 0.3 | 0.3 | 0.3 | 0.3 | 0.3 | 0.3 | 0.3 | 0.3 |
| Deep UV | Sensitivity ($mJ/cm^2$) | 50 | 40 | 30 | 30 | 30 | 30 | 50 | 30 | 30 | 30 | 30 |
| (1KW Xe-Hg Lamp) | Resolution (µm) | 0.3 | 0.3 | 0.3 | 0.3 | 0.3 | 0.3 | 0.3 | 0.3 | 0.3 | 0.3 | 0.3 |
| Etching Rate (nm/min)* | | 3.0 | 2.5 | 2.5 | 2.0 | 3.0 | 2.5 | 2.5 | 2.0 | 2.5 | 2.5 | 2.5 |

*$O_2$ gas plasma

Preparation Example 11

2-(3,4-Epoxycyclohexyl)ethyltrimethoxysilane (4.92 g; 0.02 mol) and methyltriethoxysilane (14.2 g; 0.08 mol) were dissolved in ethanol, and an aqueous hydrochloric acid solution was added to the resulting solution while stirring it. After reacting the resulting mixture at room temperature for 24 hours, the reaction was continued at 60° C. for another 144 hours. After completion of the reaction, the reaction mixture was introduced into distilled water, and the resulting precipitate was filtered to obtain a white polymer. The product was soluble in various organic solvents such as THF, ethanol, ethylcellosolve, MIBK, acetone, and ethyl acetate. From solutions of these solvents were obtained transparent uniform films.

Example 2

Respective resist compositions composed of one of the compositions of Example 1 and 0.5% by weight based on polymer of phenathiazine as a spectral sensitizer were coated on a silicon wafer to a thickness of about 0.3 µm, and prebaked at 100° C. for 20 minutes. After the prebaking, the coated substrates were each irradiated with ultraviolet rays using a Mask Aligner (manufactured by Canon Corporation). After the UV irradiation, the coated substrates were each subjected to the same heat treatment (PEB) as in Example 1, and then developed with the same developer as used in Example 1. $D_{50}$ was obtained for each of the resist materials as its sensitivity.

Table 2 shows the sensitivity and resolution of each resist composition. Resolution was evaluated by forming line & space patterns. All the resist compositions enabled the formation of patterns at a width of 0.5 µm.

TABLE 2

| Preparation Example | | 1 | 2 | 3 | 4 | 5 | 6 | 7 | 8 | 9 | 10 | 11 |
|---|---|---|---|---|---|---|---|---|---|---|---|---|
| UV | Sensitivity (mJ/cm$^2$) | 30 | 40 | 50 | 50 | 50 | 50 | 30 | 50 | 50 | 50 | 50 |
|    | Resolution (μm) | 0.5 | 0.5 | 0.5 | 0.5 | 0.5 | 0.5 | 0.5 | 0.5 | 0.5 | 0.5 | 0.5 |

Example 3

To the polysiloxane obtained in Preparation Example 3 was added one of the acid generators described below to prepare resist compositions, whose resist characteristics were evaluated in the same manner as in Example 1.

| | |
|---|---|
| Acid generator 1: Triphenylsulfonium hexafluoroantimonate | 2% by weight |
| Acid generator 2: Triphenylsulfonium hexafluoroarsenate | 2% by weight |
| Acid generator 3: Diphenyliodonium hexafluoroantimonate | 2% by weight |
| Acid generator 4: Bis(t-butylphenyl)iodonium trifluoromethanesulfonate | 2% by weight |
| Acid generator 5: 2,4-Bis(trichloromethyl)-6-phenyl-1,3,5-triazine | 10% by weight |
| Acid generator 6: Iron allene hexafluorophosphate complex | 5% by weight |
| Acid generator 7: Tris(2,3-dibromopropyl)isocyanurate | 5% by weight |
| Acid generator 8: 4-Methoxybenzenediazonium trifluoromethanesulfonate | 5% by weight |
| Acid generator 9: 2,4,6-Tris(trichloromethyl)-1,3,5-triazine | 5% by weight |
| Acid generator 10: Tetrabromobisphenol A | 10% by weight |
| Acid generator 11: Dibromomethyltriazine | 5% by weight | for 20 minutes. After the prebaking, each coated substrate was imagewise irradiated with a high energy radiation (electron beams, X rays, deep ultraviolet rays). On this occasion, in the case of deep UV rays, peak wavelength was set up to 257 nm (cold mirror CM-250). After the imagewise irradiation, the coated substrates were each heated on a hot plate at 80° C. for 5 minutes to effect postbaking (PEB), followed by development with a developer composed of HPRD 402 (manufactured by Fuji Hunt Co.) and water in a blend ratio of 1:1. $D_{50}$, the amount of radiation irradiated with which the thickness of the film remaining after the irradiation was 50% of the initial thickness of the film prior to the irradiation, was defined as sensitivity of the resist.

Table 4 shows the sensitivity and resolution of each resist composition. Resolution was evaluated by forming line & space patterns. Each of the resist materials enabled the formation of patterns at a width of no larger than 0.3 μm.

TABLE 3

| Preparation | Generator | 1 | 2 | 3 | 4 | 5 | 6 | 7 | 8 | 9 | 10 | 11 |
|---|---|---|---|---|---|---|---|---|---|---|---|---|
| Electron Beam (Acceleration voltage 20KV) | Sensitivity (μC/cm$^2$) | 11 | 9 | 6 | 5 | 6 | 6 | 12 | 6 | 5 | 6 | 5 |
| | Resolution (μm) | 0.2 | 0.2 | 0.2 | 0.3 | 0.2 | 0.3 | 0.3 | 0.3 | 0.3 | 0.3 | 0.2 |
| X Ray (CuL line 13.3) | Sensitivity (mJ/cm$^2$) | 84 | 73 | 67 | 63 | 66 | 67 | 84 | 66 | 65 | 68 | 65 |
| | Resolution (μm) | 0.3 | 0.3 | 0.3 | 0.3 | 0.3 | 0.3 | 0.3 | 0.3 | 0.3 | 0.3 | 0.3 |
| Deep UV (1KW Xe-Hg Lamp) | Sensitivity (mJ/cm$^2$) | 55 | 45 | 33 | 32 | 32 | 33 | 54 | 34 | 32 | 32 | 31 |
| | Resolution (μm) | 0.3 | 0.3 | 0.3 | 0.3 | 0.3 | 0.3 | 0.3 | 0.3 | 0.3 | 0.3 | 0.3 |

Example 4

The polysiloxanes obtained in Preparation Examples 1 to 11 were each mixed with 10% by weight of novolak resin and 10% by weight of 2,6-dinitrobenzyl tosylate to prepare resist compositions. Each of the resist compositions was coated on a silicon wafer to a thickness of about 0.3 μm by a conventional spin coating method, and prebaked at 100° C.

TABLE 4

| Preparation | Example | 1 | 2 | 3 | 4 | 5 | 6 | 7 | 8 | 9 | 10 | 11 |
|---|---|---|---|---|---|---|---|---|---|---|---|---|
| Electron Beam (Acceleration voltage 20KV) | Sensitivity (μC/cm$^2$) | 10 | 8 | 5 | 5 | 5 | 5 | 10 | 5 | 5 | 5 | 5 |
| | Resolution (μm) | 0.2 | 0.2 | 0.2 | 0.3 | 0.2 | 0.3 | 0.3 | 0.3 | 0.3 | 0.2 | 0.2 |
| X Ray (CuL line 13.3) | Sensitivity (mJ/cm$^2$) | 80 | 70 | 65 | 60 | 65 | 65 | 80 | 64 | 65 | 65 | 65 |
| | Resolution (μm) | 0.3 | 0.3 | 0.3 | 0.3 | 0.3 | 0.3 | 0.3 | 0.3 | 0.3 | 0.3 | 0.3 |
| Deep UV | Sensitivity (mJ/cm$^2$) | 50 | 40 | 30 | 30 | 30 | 30 | 50 | 30 | 30 | 30 | 30 |

TABLE 4-continued

| Preparation | Example | 1 | 2 | 3 | 4 | 5 | 6 | 7 | 8 | 9 | 10 | 11 |
|---|---|---|---|---|---|---|---|---|---|---|---|---|
| (1KW Xe-Hg Lamp C, = 250 nm) | Resolution (μm) | 0.3 | 0.3 | 0.3 | 0.3 | 0.3 | 0.3 | 0.3 | 0.3 | 0.3 | 0.3 | 0.3 |
| Etching Rate (nm/min)* | | 3.0 | 2.5 | 2.5 | 2.0 | 3.0 | 2.5 | 2.5 | 2.0 | 2.5 | 2.5 | 2.5 |

*$O_2$ gas plasma

Example 5

Resist compositions composed of one of the resist compositions of Example 4 and 0.5% by weight based on polymer of phenathiazine as a spectral sensitizer were each coated on a silicon wafer to a thickness of about 0.3 μm, and prebaked at 100° C. for 20 minutes. After the prebaking, the coated substrates were each irradiated with ultraviolet rays using a Mask Aligner (manufactured by Canon Corporation). After the UV irradiation, the coated substrates were each subjected to the same heat treatment (PEB) as in Example 1, and then developed with the same developer as used in Example 1. $D_{50}$ was obtained for each of the resist materials as its sensitivity.

Table 5 shows the sensitivity and resolution of each resist composition. Resolution was evaluated by forming line & space patterns. Each of the resist compositions enabled the formation of patterns at a width of 0.5 μm.

| | |
|---|---|
| Acid generator 4: Bis(t-butylphenyl)iodonium trifluoromethanesulfonate | 2% by weight |
| Acid generator 5: 2,4-Bis(trichloromethyl)-6-phenyl-1,3,5-triazine | 10% by weight |
| Acid generator 6: Iron allene hexafluorophosphate complex | 5% by weight |
| Acid generator 7: Tris(2,3-dibromopropyl)isocyanurate | 5% by weight |
| Acid generator 8: 4-Methoxybenzenediazonium trifluoromethanesulfonate | 5% by weight |
| Acid generator 9: 2,4,6-Tris(trichloromethyl)-1,3,5-triazine | 5% by weight |
| Acid generator 10: Tetrabromobisphenol A | 10% by weight |
| Acid generator 11: | 5% by weight |

TABLE 5

| Preparation Example | | 1 | 2 | 3 | 4 | 5 | 6 | 7 | 8 | 9 | 10 | 11 |
|---|---|---|---|---|---|---|---|---|---|---|---|---|
| UV | Sensitivity (mJ/cm$^2$) | 30 | 40 | 50 | 50 | 50 | 50 | 30 | 50 | 50 | 50 | 50 |
| | Resolution (μm) | 0.5 | 0.5 | 0.5 | 0.5 | 0.5 | 0.5 | 0.5 | 0.5 | 0.5 | 0.5 | 0.5 |

Example 6

To the polysiloxane obtained in Preparation Example 3 were added 10% by weight of novolak resin and one of the acid generators described below to prepare resist compositions, whose resist characteristics were evaluated in the same manner as in Example 1.

| | |
|---|---|
| Acid generator 1: Triphenylsulfonium hexafluoroantimonate | 2% by weight |
| Acid generator 2: Triphenylsulfonium hexafluoroarsenate | 2% by weight |
| Acid generator 3: Diphenyliodonium hexafluoroantimonate | 2% by weight |
| Dibromomethyltriazine | |

The results obtained are shown in Table 6.

TABLE 6

| Preparation | Generator | 1 | 2 | 3 | 4 | 5 | 6 | 7 | 8 | 9 | 10 | 11 |
|---|---|---|---|---|---|---|---|---|---|---|---|---|
| Electron Beam (Acceleration voltage 20KV) | Sensitivity (μC/cm$^2$) | 11 | 9 | 6 | 5 | 6 | 6 | 12 | 6 | 5 | 6 | 5 |
| | Resolution (μm) | 0.2 | 0.2 | 0.2 | 0.3 | 0.2 | 0.3 | 0.3 | 0.3 | 0.3 | 0.3 | 0.2 |
| X Ray (Cuℓ line 13.3) | Sensitivity (mJ/cm$^2$) | 84 | 73 | 67 | 63 | 66 | 67 | 84 | 66 | 65 | 68 | 65 |
| | Resolution (μm) | 0.3 | 0.3 | 0.3 | 0.3 | 0.3 | 0.3 | 0.3 | 0.3 | 0.3 | 0.3 | 0.3 |
| Deep UV (1KW Xe-Hg Lamp Cm = 250 nm) | Sensitivity (mJ/cm$^2$) | 55 | 45 | 33 | 32 | 32 | 33 | 54 | 34 | 32 | 32 | 31 |
| | Resolution (μm) | 0.3 | 0.3 | 0.3 | 0.3 | 0.3 | 0.3 | 0.3 | 0.3 | 0.3 | 0.3 | 0.3 |

Example 7

To the polysiloxane obtained in Preparation Example 1 was added 3% by weight of triphenylsulfonium trifluoromethanesulfonate and 10% by weight of one of the organic polymers having a hydroxyl group shown in Table 7 to prepare resist compositions. The resist characteristics of the resist compositions were evaluated in the same manner as in Example 1. The results obtained are shown in Table 7.

TABLE 7

| Organic polymer having a hydroxyl group | | Novolak | Phenol resin | Polyvinylphenol |
|---|---|---|---|---|
| Electron Beam | Sensitivity (μC/cm$^2$) | 5 | 6 | 6 |
| (Acceleration voltage 20KV) | Resolution (μm) | 0.3 | 0.2 | 0.3 |
| X Ray | Sensitivity (mJ/cm$^2$) | 63 | 66 | 67 |
| (CuI line 13.3) | Resolution (μm) | 0.3 | 0.3 | 0.3 |
| Deep UV | Sensitivity (mJ/cm$^2$) | 32 | 32 | 33 |
| (1KW He-Hg Lamp Cm = 250 nm) | Resolution (μm) | 0.3 | 0.3 | 0.3 |

Example 8

Silicon wafers were each coated with AZ-1350 resist (produced by Hoechst AG) to a thickness of 3 μm, and heated at 200° C. for 30 minutes to insolubilize. The respective resist compositions used in Examples 1 to 6 were coated on the AZ-1350 resists each to a thickness of about 0.3 μm, and prebaked at 100° C. for 20 minutes. After the prebaking, high energy radiation (electron beams, X rays, deep UV rays, or UV rays) was irradiated on each of the coated substrates. Then, the substrates thus treated were heated in the same manner as in Example 1, and developed with a developer having the same composition as that used in Example 1 to form patterns. Thereafter, the AZ resists were etched in a parallel flat plate type sputter etching apparatus using oxygen gas as an etching gas and one of the aforementioned resist patterns as a mask. After etching performed under the conditions of RF power: 0.2 W/cm$^2$, and O$_2$ gas pressure: 20 mTorr, for 15 minutes, the AZ resist in the portion uncovered with the resist pattern disappeared completely.

All the resist compositions used in Example 1 gave rise to 0.3 μm line & space patterns each in a thickness of about 3 μm while the use of the resist compositions in Example 2 enabled the formation of 0.5 μm line & space patterns.

Example 9

A mixture of one of the polysiloxanes obtained in Preparation Examples 1 to 11, 10% by weight of polyvinylphenol, and 3% by weight of diphenyl-4-thiophenoxyphenylsulfonium hexafluorophosphate was dissolved in methoxy-2-propanol to prepare resist compositions. Each of the resist compositions was coated on a silicon wafer to a thickness of about 0.3 μm by a conventional spin coating method, and prebaked at 100° C. for 20 minutes. After the prebaking, each coated substrate was imagewise irradiated with a high energy radiation (electron beams, X rays, or deep ultraviolet rays). On this occasion, in the case of deep UV rays, peak wavelength was set up to 257 nm (cold mirror CM-250). After the imagewise irradiation, the coated substrates were each heated on a hot plate at 80° C. for 5 minutes to effect postbaking (PEB), followed by development with a developer composed of HPRD 402 (manufactured by Fuji Hunt Co.) and water in a blend ratio of 1:1. D$_{50}$, the amount of radiation irradiated with which the thickness of the film remaining after the irradiation was 50% of the initial thickness of the film prior to the irradiation, was defined as sensitivity of the resist.

Table 8 shows the sensitivity and resolution of each resist composition. Resolution was evaluated by forming line & space patterns. Each of the resist compositions enabled the formation of patterns at a width of no larger than 0.25 μm.

TABLE 8

| Preparation | Example | 1 | 2 | 3 | 4 | 5 | 6 | 7 | 8 | 9 | 10 | 11 |
|---|---|---|---|---|---|---|---|---|---|---|---|---|
| Electron Beam | Sensitivity (μC/cm$^2$) | 12 | 10 | 7 | 7 | 7 | 7 | 12 | 7 | 7 | 7 | 7 |
| (Acceleration voltage 20KV) | Resolution (μm) | 0.2 | 0.2 | 0.2 | 0.2 | 0.2 | 0.2 | 0.2 | 0.2 | 0.2 | 0.2 | 0.2 |
| X Ray | Sensitivity (mJ/cm$^2$) | 90 | 80 | 75 | 70 | 75 | 75 | 90 | 74 | 75 | 75 | 75 |
| (CuI line 13.3) | Resolution (μm) | 0.2 | 0.2 | 0.2 | 0.2 | 0.2 | 0.2 | 0.2 | 0.2 | 0.2 | 0.2 | 0.2 |
| Deep UV | Sensitivity (mJ/cm$^2$) | 55 | 45 | 35 | 35 | 35 | 35 | 55 | 35 | 35 | 35 | 35 |
| (1KW Xe-Hg Lamp Cm = 250 nm) | Resolution (μm) | 0.25 | 0.25 | 0.25 | 0.25 | 0.25 | 0.25 | 0.25 | 0.25 | 0.25 | 0.25 | 0.25 |
| Etching Rate (nm/min)* | | 3.0 | 2.5 | 2.5 | 2.0 | 3.0 | 2.5 | 2.5 | 2.0 | 2.5 | 2.5 | 2.5 |

*O$_2$ gas plasma

Example 10

Resist compositions composed of one of the resist compositions of Example 9 and 0.5% by weight based on polymer of phenathiazine as a spectral sensitizer were each coated on a silicon wafer to a thickness of about 0.3 μm, and prebaked at 100° C. for 20 minutes. After the prebaking, the coated substrates were each irradiated with UV rays using an i-line stepper (manufactured by Nikon). After the UV irradiation, the coated substrates were each subjected to the same heat treatment (PEB) as in Example 9, and then developed with the same developer as used in Example 9. D$_{50}$ was obtained for each of the resist materials as its sensitivity.

Table 9 shows the sensitivity and resolution of each resist composition. Resolution was evaluated by forming line & space patterns. All the resist compositions enabled the formation of patterns at a width of 0.35 μm.

TABLE 9

| Preparation Example | | 1 | 2 | 3 | 4 | 5 | 6 | 7 | 8 | 9 | 10 | 11 |
|---|---|---|---|---|---|---|---|---|---|---|---|---|
| UV | Sensitivity (mJ/cm$^2$) | 35 | 45 | 55 | 55 | 55 | 55 | 35 | 55 | 55 | 55 | 55 |
| | Resolution (μm) | 0.4 | 0.4 | 0.4 | 0.4 | 0.4 | 0.4 | 0.4 | 0.4 | 0.4 | 0.4 | 0.4 |

Example 11

To the polysiloxane obtained in Preparation Example 6 were added 10% by weight of polyvinylphenol, and one of the acid generators described below to prepare resist compositions, whose resist characteristics were evaluated in the same manner as in Example 9.

| | |
|---|---|
| Acid generator 1: | 2% by weight |
| Triphenylsulfonium hexafluoroantimonate | |
| Acid generator 2: | 2% by weight |
| Triphenylsulfonium hexafluoroarsenate | |
| Acid generator 3: | 2% by weight |
| Diphenyliodonium hexafluoroantimonate | |
| Acid generator 4: | 2% by weight |
| Bis(t-butylphenyl)iodonium trifluoromethanesulfonate | |
| Acid generator 5: | 10% by weight |
| 2,4-Bis(trichloromethyl)-6-phenyl-1,3,5-triazine | |
| Acid generator 6: | 5% by weight |
| Iron allene hexafluorophosphate complex | |
| Acid generator 7: | 5% by weight |
| Tris(2,3-dibromopropyl)isocyanurate | |
| Acid generator 8: | 5% by weight |
| 4-Methoxybenzenediazonium trifluoromethanesulfonate | |
| Acid generator 9: | 5% by weight |
| 2,4,6-Tris(trichloromethyl)-1,3,5-triazine | |
| Acid generator 10 | 10% by weight |
| Tetrabromobisphenol A | |
| Acid generator 11: | 5% by weight |
| Dibromomethyltriazine | |
| Acid generator 12: | 10% by weight |
| 2,6-Dinitrobenzyl tosylate | |

The results obtained are shown in Table 10.

the prebaking, high energy radiation (electron beams, X rays, deep UV rays, or UV rays) was irradiated on each of the coated substrates. Then, the substrates thus treated were heated in the same manner as in Examples 9 or 10, and developed with a developer having the same composition as that used in Example 9 to form patterns. Thereafter, the AZ resists were etched in a parallel flat plate type sputter etching apparatus using oxygen gas as an etching gas and one of the aforementioned resist patterns as a mask. After etching performed under the conditions of RF power: 0.2 W/cm$^2$, and O$_2$ gas pressure: 20 mTorr, for 15 minutes, the AZ resist in the portion uncovered with the resist pattern disappeared completely.

All the resist compositions used in Example 9 gave rise to at most 0.25 μm line & space patterns each in a thickness of about 3 μm while the use of the resist compositions in Example 10 enabled the formation of 0.35 m line & space patterns.

Example 13

To the polysiloxane obtained in Preparation Example 6 was added 3% by weight of diphenyl-4-thiophenoxyphenylsulfonium hexafluorophosphate and 10% by weight of one of the organic polymers having a hydroxyl group shown in Table 11 to prepare resist compositions. The resist characteristics of the resist compositions were evaluated in the same manner as in Example 9. The results obtained are shown in Table 11.

TABLE 10

| Acid | Generator | 1 | 2 | 3 | 4 | 5 | 6 | 7 | 8 | 9 | 10 | 11 | 12 |
|---|---|---|---|---|---|---|---|---|---|---|---|---|---|
| Electron Beam | Sensitivity (μC/cm$^2$) | 13 | 11 | 8 | 7 | 8 | 8 | 14 | 8 | 7 | 8 | 7 | 12 |
| (Acceleration voltage 20KV) | Resolution (μm) | 0.2 | 0.2 | 0.2 | 0.2 | 0.2 | 0.2 | 0.2 | 0.2 | 0.2 | 0.2 | 0.2 | 0.2 |
| X Ray | Sensitivity (mJ/cm$^2$) | 94 | 83 | 77 | 73 | 76 | 77 | 94 | 76 | 76 | 78 | 74 | 87 |
| (CuI line 13.3) | Resolution (μm) | 0.2 | 0.2 | 0.2 | 0.2 | 0.2 | 0.2 | 0.2 | 0.2 | 0.2 | 0.2 | 0.2 | 0.2 |
| Deep UV | Sensitivity (mJ/cm$^2$) | 65 | 55 | 43 | 42 | 42 | 43 | 64 | 44 | 42 | 42 | 41 | 60 |
| (1KW Xe-Hg Lamp Cm = 250 nm) | Resolution (μm) | 0.25 | 0.25 | 0.25 | 0.25 | 0.25 | 0.25 | 0.25 | 0.25 | 0.25 | 0.25 | 0.25 | 0.25 |

Example 12

Silicon wafers were each coated with AZ-1350 resist (produced by Hoechst AG) to a thickness of 3 μm, and heated at 200° C. for 30 minutes to insolubilize. The respective resist compositions used in Examples 9, 10 or 11 were coated on the AZ-1350 resists each to a thickness of about 0.3 μm, and prebaked at 100° C. for 20 minutes. After

TABLE 11

| Organic polymer having a hydroxyl group | | Novolak | Phenol resin | Pyrogallol-acetone resin |
|---|---|---|---|---|
| Electron Beam | Sensitivity (μC/cm$^2$) | 5 | 6 | 6 |
| (Acceleration voltage 20KV) | Resolution (μm) | 0.3 | 0.2 | 0.3 |
| X Ray | Sensitivity (mJ/cm$^2$) | 63 | 66 | 67 |
| (Cul line 13.3) | Resolution (μm) | 0.3 | 0.3 | 0.3 |
| Deep UV | Sensitivity (mJ/cm$^2$) | 32 | 32 | 33 |
| (1KW Xe-Hg Lamp Cm = 250 nm) | Resolution (μm) | 0.3 | 0.3 | 0.3 |

Example 14

Figure 5:
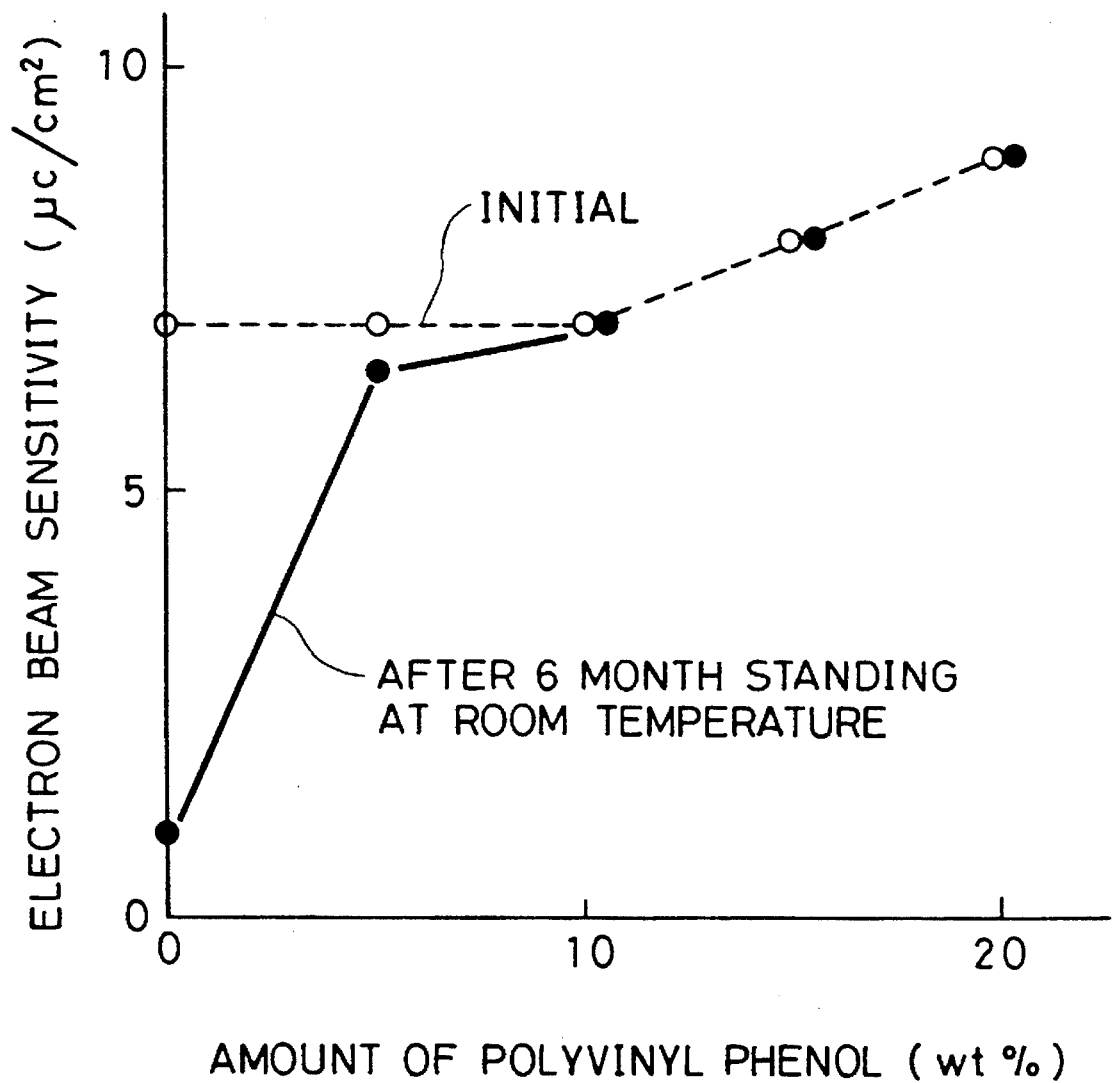
FIG. 5 is a graph illustrating the relationship between the sensitivity and storage stability of the resist material prepared according to Preparation Example 6 of the present invention and the amount of polyvinylphenol contained therein, the sensitivity being evaluated initially and after 6 month standing.

To the polysiloxane obtained in Preparation Example 6 were added 3% by weight of diphenyl-4-thiophenoxyphenylsulfonium hexafluorophosphate and a certain amount of polyvinylphenol to obtain resist compositions. The sensitivities thereof were evaluated after having left the resist compositions to stand at room temperature for 6 months. FIG. 5 shows the relationship between the amount of the polyvinylphenol and sensitivity. As will be understood from FIG. 5, the addition of polyvinylphenol resin resulted in a slight decrease in the sensitivity but in considerable improvement in the stability with time. In other words, resist compositions with no polyvinylphenol showed a larger change in the sensitivity after standing at room temperature for 6 months as compared with the resist compositions to which the polyvinylphenol was added.

Example 15

Figure 6:
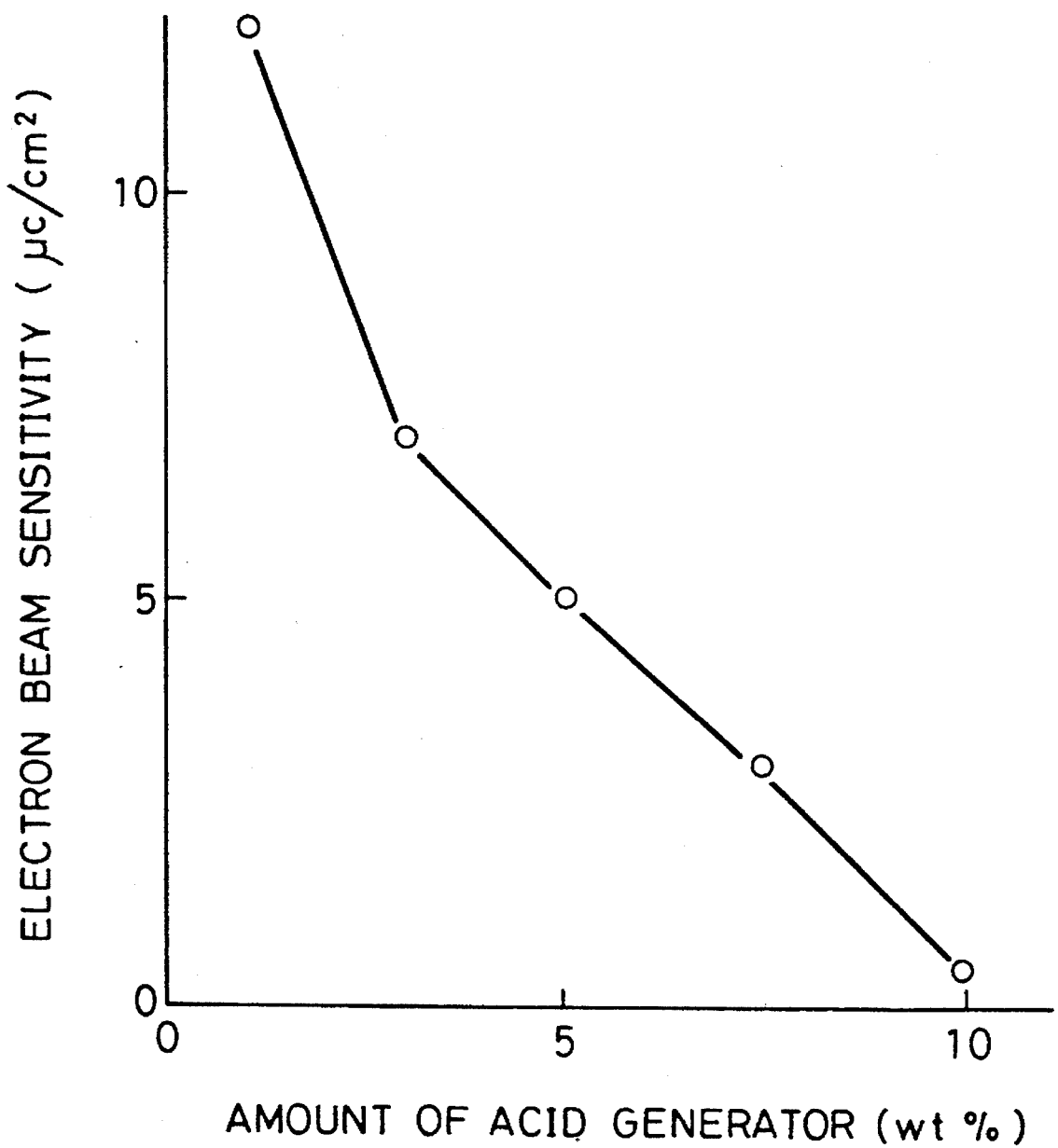
FIG. 6 is a graph illustrating the relationship between the sensitivity of the resist material prepared according to Preparation Example 6 of the present invention and the amount of diphenyl-4-thiophenoxyphenylsulfonium hexafluorophosphate contained therein.

To the polysiloxane obtained in Preparation Example 6 were added a certain amount of diphenyl-4-thiophenoxyphenyl-sulfonium hexafluorophosphate and 10% by weight of polyvinylphenol to obtain resist compositions. The sensitivities thereof were evaluated after having left the resist compositions to stand at room temperature for 6 months. FIG. 6 shows the relationship between the amount of the diphenyl-4-thiophenoxyphenylsulfonium hexafluorophosphate added and sensitivity. As will be understood from FIG. 6, the larger the amount the higher the sensitivity but the lower the storage stability.

Example 16

To the polysiloxane obtained in Preparation Example 6 were added 3% by weight of triphenylphosphonium trifluoromethanesulfonate and 5% by weight of one of the epoxy compounds shown in Table 12 to obtain resist compositions. The resist characteristics of the resist compositions were evaluated in the same manner as in Example 9. The results obtained are shown in Table 12.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A negative working resist material, comprising:

(a) a polysiloxane obtained by hydrolysis and condensation with dehydration of an alkoxysilane including an oxirane ring therein, said polysiloxane having at least one silanol group and including therein partial structural units represented by formulae (1), (2) and (3) in combinations with respect to one another of (1), and (2) and/or (3) in which all bonds not shown are to oxygen:

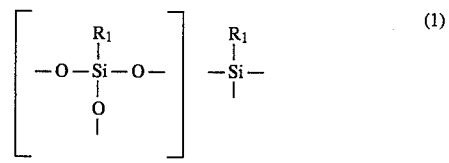

(1)

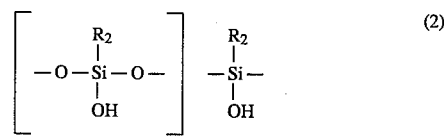

(2)

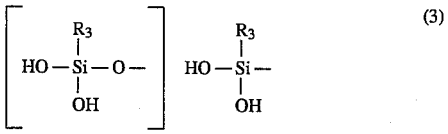

(3)

wherein $R_1$, $R_2$ and $R_3$ are organic groups which may be the same or different, wherein at least one of the organic groups represented by $R_1$, $R_2$ and $R_3$, respectively, include an oxirane ring therein, and wherein at least one said oxirane ring in said partial structural units has been hydrolyzed to form a glycol group, which glycol group is present in said polysiloxane; and (b) an acid generator.

TABLE 12

| Epoxy Compound | | Ethyleneglycol diglycidyl | Epikote 815 | Epikote 1001 | Epoxystyrene | Epoxybutane |
|---|---|---|---|---|---|---|
| Electron Beam | Sensitivity (μC/cm$^2$) | 8 | 9 | 10 | 9 | 8 |
| (Acceleration voltage 20KV) | Resolution (μm) | 0.2 | 0.2 | 0.2 | 0.2 | 0.2 |
| X Ray | Sensitivity (mJ/cm$^2$) | 75 | 78 | 79 | 78 | 75 |
| (Cul line 13.3) | Resolution (μm) | 0.2 | 0.2 | 0.2 | 0.2 | 0.2 |
| Deep UV | Sensitivity (mJ/cm$^2$) | 45 | 47 | 46 | 47 | 45 |
| (1KW Xe-Hg Lamp Cm = 250 nm) | Resolution (μm) | 0.25 | 0.25 | 0.25 | 0.25 | 0.25 |

2. A negative working resist material as claimed in claim 1, wherein $R_1$, $R_2$ and $R_3$, which may be the same or different, are selected from the group consisting of a 2-(3,4-epoxycyclohexyl)ethyl group and a phenyl group.

3. A negative working resist material as claimed in claim 1, wherein organic groups $R_1$, $R_2$ and $R_3$ which include an oxirane ring therein are present in an amount ranging from about 20 to about 100% by mole based on a total amount of organic groups represented by said $R_1$, $R_2$ and $R_3$.

4. A negative working resist material as claimed in claim 1, wherein said polysiloxane has a weight average molecular weight ranging from about 800 to about 10,000.

5. A negative working resist material as claimed in claim 1, wherein said acid generator is selected from the group consisting of:

(i) an onium salt represented by formula (I), (II) or (III) below;

$$R'N_2^+MXn^- \qquad (I)$$

$$(R')_2I^+MXn^- \qquad (II)$$

$$(R')_3S^+MXn^- \qquad (III)$$

wherein R' represents an aromatic group, and $MXn^-$ represents a group selected from the group consisting of $BF_4^-$, $PF_6^-$, $AsF_6^-$, and $SbF_6^-$, (ii) a halomethyltriazine, (iii) tetrabromobisphenol A, (iv) a nitrobenzyl ester compound, and (v) a trifluoromethanesulfonate compound.

6. A negative working resist material as claimed in claim 5, wherein said acid generator is diphenyl-4-thiophenoxyphenylsulfonium hexafluorophosphate.

7. A negative working resist material as claimed in claim 1, wherein said acid generator is present in an amount ranging from about 0.5 to about 20% by weight based on the weight of said negative working resist material.

8. A negative working resist material as claimed in claim 1, further comprising a spectral sensitizer.

9. A negative working resist material as claimed in claim 8, wherein said spectral sensitizer is phenathiazine.

10. A negative working resist material as claimed in claim 1, further comprising an organic polymer having a hydroxyl group.

11. A negative working resist material as claimed in claim 10, wherein said organic polymer having a hydroxyl group is selected from the group consisting of a novolak resin, a phenol resin, a pyrogallol acetone polymer, and a polyvinyl phenol.

12. A negative working resist material as claimed in claim 10, wherein said organic polymer having a hydroxyl group is present in an amount which does not exceed about 10% by weight.

13. A negative working resist material as claimed in claim 1, further comprising an epoxy compound.

14. A negative working resist material as claimed in claim 13, wherein said epoxy compound is selected from the group consisting of an ethylene glycol diglycidyl, an epoxy resin, an epoxystyrene, and an epoxybutane.

15. A negative working resist material as claimed in claim 13, wherein said epoxy resin is present in an amount which does not exceed about 5% by weight based on the weight of said negative working resist material.

16. The negative working resist material according to claim 1, wherein the polysiloxane has partial structural units selected from the group consisting of (a) (1) and (2), and (b) (1) and (2) and (3).

17. The negative working resist material according to claim 1, wherein the polysiloxane is at least one polysiloxane selected from the group consisting of polysiloxanes represented by formulae (4a), (4b), (4c), (4d), and (4e):

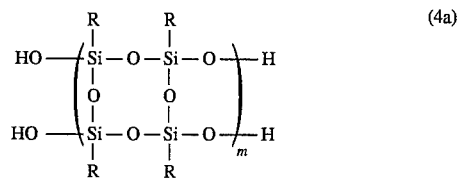

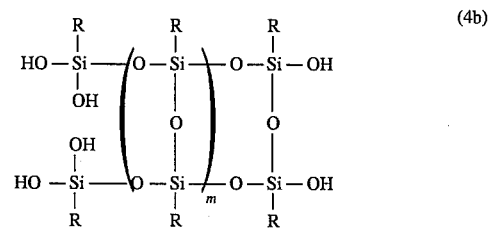

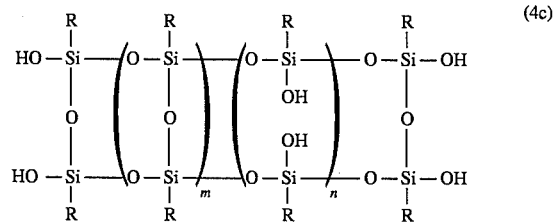

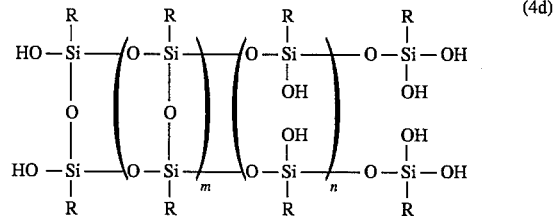

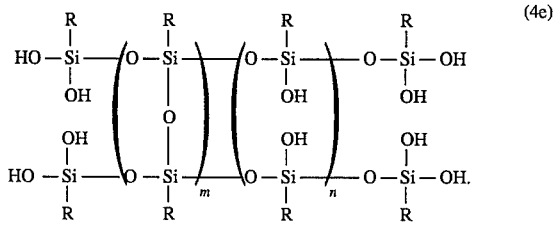

wherein R represents organic groups which are the same or different, each R having the same meaning as one of $R_1$, $R_2$ or $R_3$; and m=1 to 10, n=0 to 10, and m+n≦10.

18. The negative working resist material according to claim 1, wherein the polysiloxane is at least one polysiloxane selected from the group consisting of polysiloxanes represented by formulae (5a), (5b), (5c), (5d), and (5e):

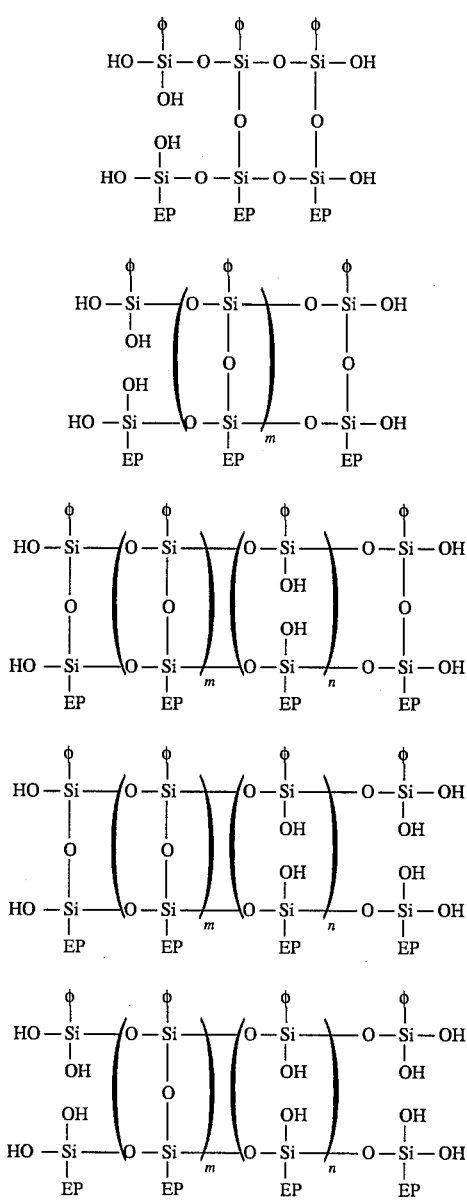

wherein EP represents 2-(3,4-epoxycyclohexyl)ethyl group; φ represents a phenyl group, provided that any φ may be interchanged for any EP and any EP may be interchanged for any φ so far as said polysiloxane (5a), (5b), (5c), (5d) or (5e) contains at least one 2-(3,4-epoxycyclohexyl)ethyl group; and m=1 to 10, n=1 to 10, and m+n≦10.

19. The negative working resist material according to claim 1, wherein the polysiloxane is obtained by hydrolysis and condensation with dehydration of a mixture of phenyltrimethoxysilane and 2-(3,4-epoxycyclohexyl)-ethyltrimethoxysilane.

20. A negative working resist material as claimed in claim 1, wherein the organic groups represented by $R_1$, $R_2$ or $R_3$, respectively, that contain no oxirane ring are groups selected from the group consisting of an alkyl group, an alkenyl group, a cycloalkyl group, and a phenyl group.

21. A negative working resist material as claimed in claim 20, wherein at least one of the organic groups which include an oxirane ring is selected from the group consisting of an 3-glycidoxypropyl group, a 2-(3,4-epoxycyclohexyl)ethyl group, and a 4-tetrahydrophthalic anhydride group.

22. A negative working resist material as claimed in claim 21, wherein at least one of the organic groups which include an oxirane ring is a 2-(3,4-epoxycyclohexyl)ethyl group.

23. A negative working resist material as claimed in claim 20, wherein the organic groups represented by $R_1$, $R_2$ or $R_3$, respectively, that contain no oxirane ring are groups selected from the group consisting of a methyl group, an ethyl group, and a phenyl group.

24. A negative working resist material as claimed in claim 23, wherein the organic groups represented by $R_1$, $R_2$ or $R_3$, respectively, that contain no oxirane ring are phenyl groups.

25. A negative working resist material, comprising:
(a) a polysiloxane obtained by hydrolysis and condensation with dehydration of an alkoxysilane having an oxirane ring alone, or together with an alkoxysilane free of an oxirane ring, said polysiloxane having at least one silanol group, and having at least one glycol group formed by hydrolysis of at least one oxirane ring; and
(b) an acid generator.

26. A method of producing a negative working resist material, comprising the steps of:
(a) hydrolyzing an alkoxysilane including an oxirane ring therein to form a hydrolyzate;
(b) condensing with dehydration said hydrolyzate to form a polysiloxane having at least one silanol group and having at least one glycol group formed by hydrolysis of at least one oxirane ring; and
(c) mixing said polysiloxane with an acid generator.

27. A method of producing a negative working resist material, comprising the steps of:
(a) hydrolyzing an alkoxysilane including an oxirane ring therein and an alkoxysilane free of an oxirane ring to form a hydrolyzate;
(b) condensing with dehydration said hydrolyzate to form a polysiloxane having at least one silanol group and having at least one glycol group formed by hydrolysis of at least one oxirane ring; and
(c) mixing said polysiloxane with an acid generator.

28. The method according to claim 27, wherein the polysiloxane is obtained by hydrolysis and condensation with dehydration of a mixture of phenyltrimethoxysilane and 2-(3,4-epoxycyclohexyl)-ethyltrimethoxysilane.

29. A process of forming resist patterns, comprising the steps of:
(a) applying an organic polymer onto a substrate to form a bottom layer on said substrate;
(b) providing a negative working resist comprised of:
(1) a polysiloxane obtained by hydrolysis and condensation with dehydration of an alkoxysilane including an oxirane ring therein, said polysiloxane having at least one silanol group and including therein partial structural units represented by formulae (1), (2) and (3) in combinations with respect to one another of (1), and (2) and/or (3) in which all bonds not shown are to oxygen:

-continued

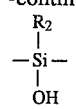 (2)

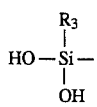 (3)

wherein $R_1$, $R_2$ and $R_3$ each represent an organic group which may be the same or different, wherein at least one of the organic groups represented by $R_1$, $R_2$ and $R_3$, respectively, include an oxirane ring therein, and wherein at least one said oxirane ring in said partial structural units has been hydrolyzed to form a glycol group, which glycol group is present in said polysiloxane, and (2) an acid generator;

(c) coating the negative working resist material onto said bottom layer to form a top layer and form a two layer resist on said substrate;

(d) prebaking said two layer resist;

(e) imagewise exposing said prebaked two layer resist with high energy radiation to obtain an exposed two layer resist having an exposed portion of said top layer and an unexposed portion of said top layer;

(f) postbaking said exposed two layer resist to render said exposed portion of said top layer insoluble in an alkali developer;

(g) developing said exposed two layer resist with an alkali developer to remove said unexposed portion of said top layer while retaining said insolubilized, exposed portion of said top layer on said bottom layer to form space corresponding to said unexposed portion of said top layer; and (h) dry etching said bottom layer using said remaining exposed portion of said top layer as a mask to remove said bottom layer in a region beneath said space corresponding to said unexposed portion of said top layer.

30. The process as claimed in claim 29, wherein said postbaking is performed at a temperature which is lower than that at which said prebaking is carried out.

31. The process according to claim 29, wherein the polysiloxane is obtained by hydrolysis and condensation with dehydration of a mixture of phenyltrimethoxysilane and 2-(3,4-epoxycyclohexyl)-ethyltrimethoxysilane.

* * * * *